(12) United States Patent
He

(10) Patent No.: US 11,710,717 B2
(45) Date of Patent: Jul. 25, 2023

(54) METHODS FOR MULTI-WAFER STACKING AND DICING

(71) Applicant: YANGTZE MEMORY TECHNOLOGIES CO., LTD., Wuhan (CN)

(72) Inventor: Jialan He, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 244 days.

(21) Appl. No.: 16/862,298

(22) Filed: Apr. 29, 2020

(65) Prior Publication Data

US 2021/0210460 A1 Jul. 8, 2021

Related U.S. Application Data

(63) Continuation of application No. PCT/CN2020/070614, filed on Jan. 7, 2020.

(51) Int. Cl.
*H01L 21/00* (2006.01)
*H01L 23/367* (2006.01)
(Continued)

(52) U.S. Cl.
CPC .............. *H01L 24/80* (2013.01); *H01L 21/78* (2013.01); *H01L 24/08* (2013.01);
(Continued)

(58) Field of Classification Search
CPC ....... H01L 21/6835; H01L 2221/68327; H01L 24/94; H01L 25/0657
See application file for complete search history.

(56) References Cited

U.S. PATENT DOCUMENTS 8,329,561 B2   12/2012 Saeki
9,748,182 B2 *  8/2017 Nakamura ........ H01L 21/67132
(Continued)

FOREIGN PATENT DOCUMENTS

CN      1513204 A    7/2004
CN    101192586 A    6/2008
(Continued)

OTHER PUBLICATIONS

International Search Report issued in corresponding International Application No. PCT/CN2020/070614, dated Oct. 12, 2020, 4 pages.

*Primary Examiner* — Anthony Ho
*Assistant Examiner* — David J Goodwin
(74) *Attorney, Agent, or Firm* — Bayes PLLC

(57) ABSTRACT

A method includes providing a structure including a carrier wafer, and a first device wafer with an adhesion layer between the carrier wafer and the first device wafer; and forming a plurality of first ablation structures in the structure, each of the plurality of first ablation structures extending through the first device wafer, the adhesion layer and a portion of the carrier wafer. Each of the plurality of first ablation structures has a portion inside the carrier wafer with a depth no greater than one half of a thickness of the carrier wafer. The first device wafer includes a plurality of first dies, each pair of adjacent first dies being separated by one of the plurality of first ablation structures. The plurality of first ablation structures are formed by either laser grooving or mechanical sawing.

20 Claims, 16 Drawing Sheets

(51) Int. Cl.
  *H01L 23/373* (2006.01)
  *H01L 25/065* (2023.01)
  *H01L 23/538* (2006.01)
  *H01L 23/00* (2006.01)
  *H01L 21/78* (2006.01)
  *H01L 25/18* (2023.01)
  *H01L 25/00* (2006.01)

(52) U.S. Cl.
  CPC ......... *H01L 25/0657* (2013.01); *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2225/06524* (2013.01); *H01L 2924/1436* (2013.01); *H01L 2924/1437* (2013.01); *H01L 2924/14511* (2013.01)

(56) References Cited

U.S. PATENT DOCUMENTS

| | | | | |
|---|---|---|---|---|
| 2010/0099221 | A1* | 4/2010 | Nakamura | H01L 21/6836 438/109 |
| 2010/0330780 | A1* | 12/2010 | Hwang | H01L 21/6835 438/464 |
| 2015/0093882 | A1* | 4/2015 | Arai | B28D 5/0082 438/462 |
| 2018/0158749 | A1* | 6/2018 | Yu | H01L 23/3675 |
| 2020/0020585 | A1* | 1/2020 | Wakahara | H01L 21/3065 |

FOREIGN PATENT DOCUMENTS

| | | |
|---|---|---|
| CN | 102498548 A | 6/2012 |
| CN | 102544035 A | 7/2012 |
| CN | 104425527 A | 3/2015 |
| CN | 105118823 A | 12/2015 |
| CN | 105140213 A | 12/2015 |
| CN | 105742243 A | 7/2016 |
| CN | 107170690 A | 9/2017 |
| CN | 107195625 A | 9/2017 |
| CN | 109192717 A | 1/2019 |
| CN | 109979879 A | 7/2019 |
| CN | 110265475 A | 9/2019 |
| TW | 200512846 A | 4/2005 |
| TW | 200525784 A | 8/2005 |
| TW | 201941390 A | 10/2019 |

* cited by examiner

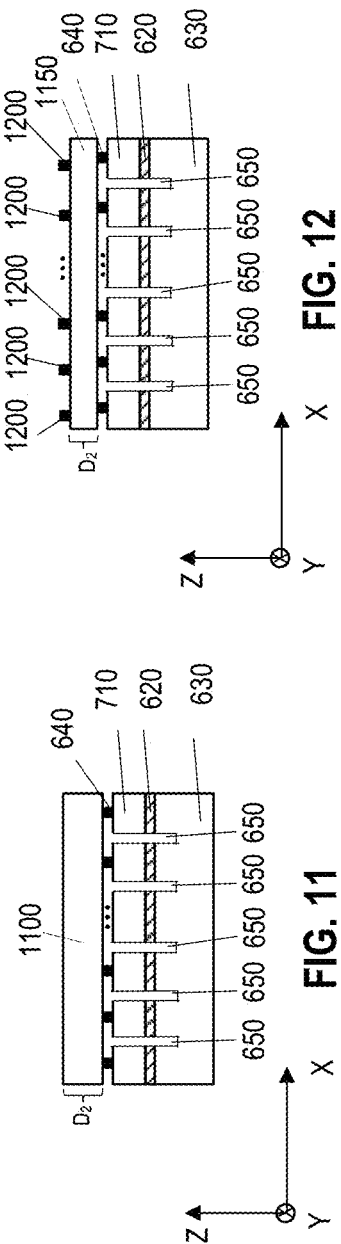
FIG. 11
FIG. 12
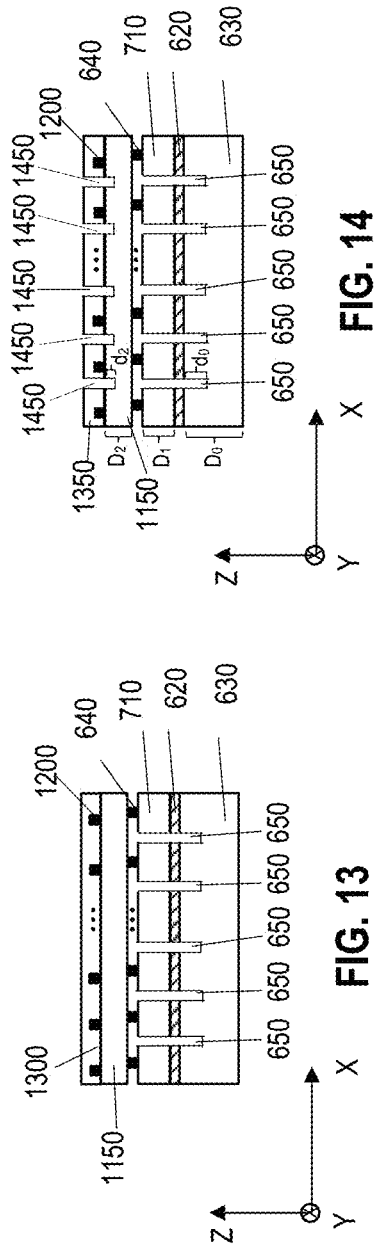
FIG. 13
FIG. 14

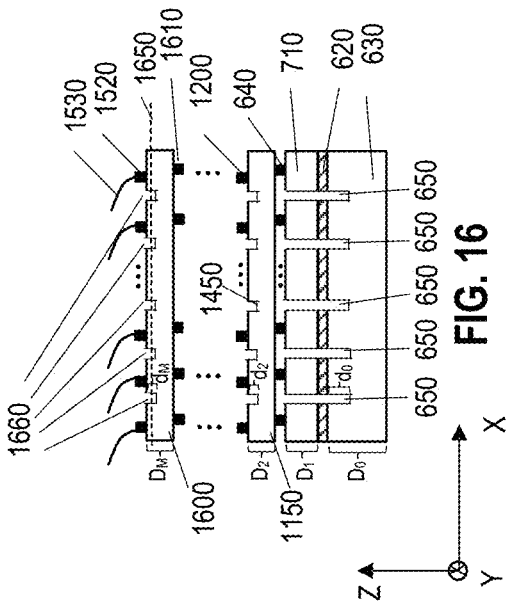
FIG. 15
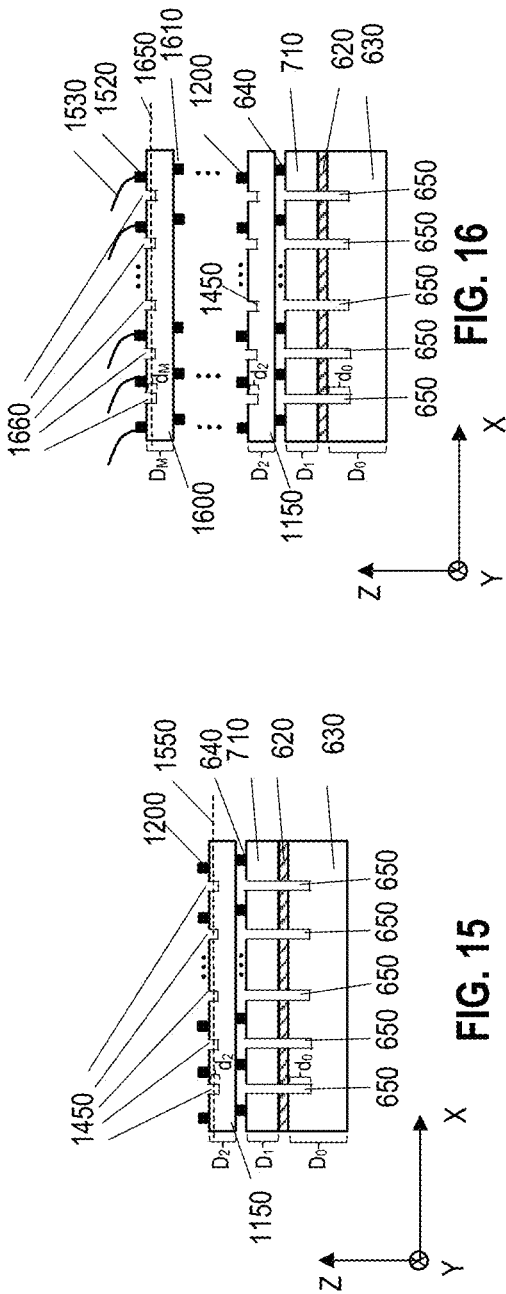
FIG. 16
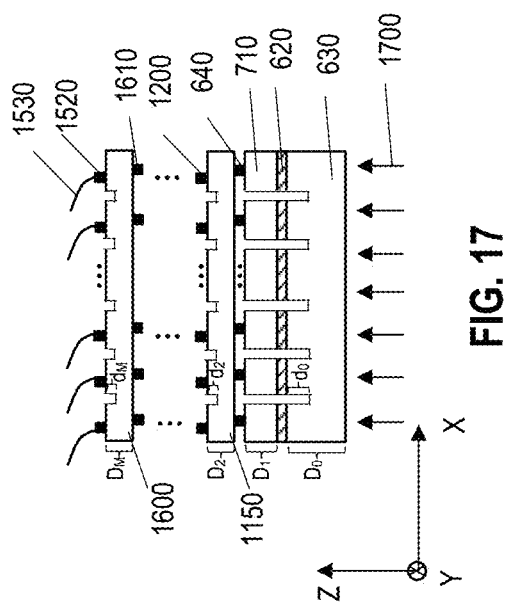
FIG. 17
FIG. 18

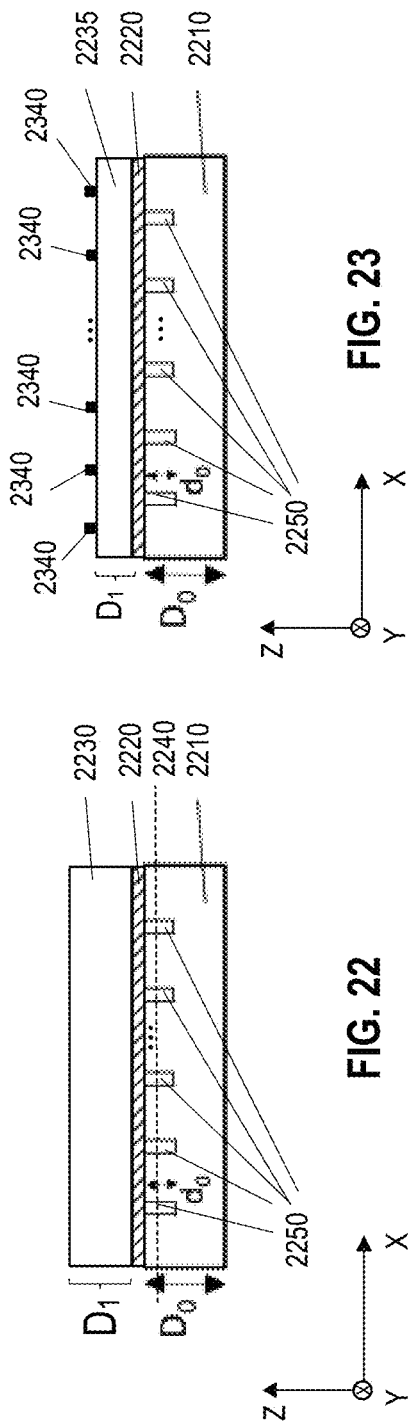
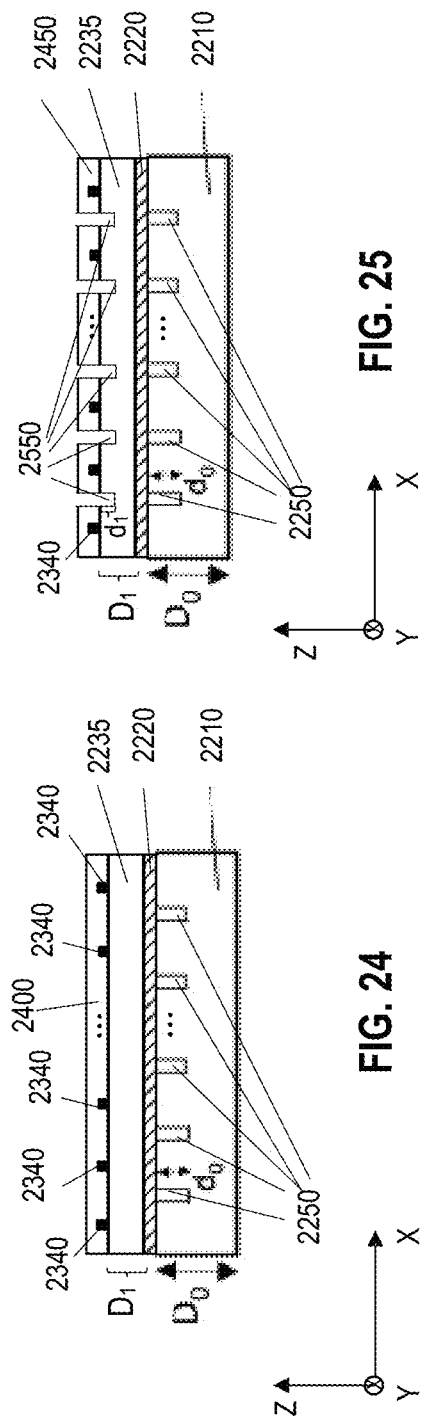

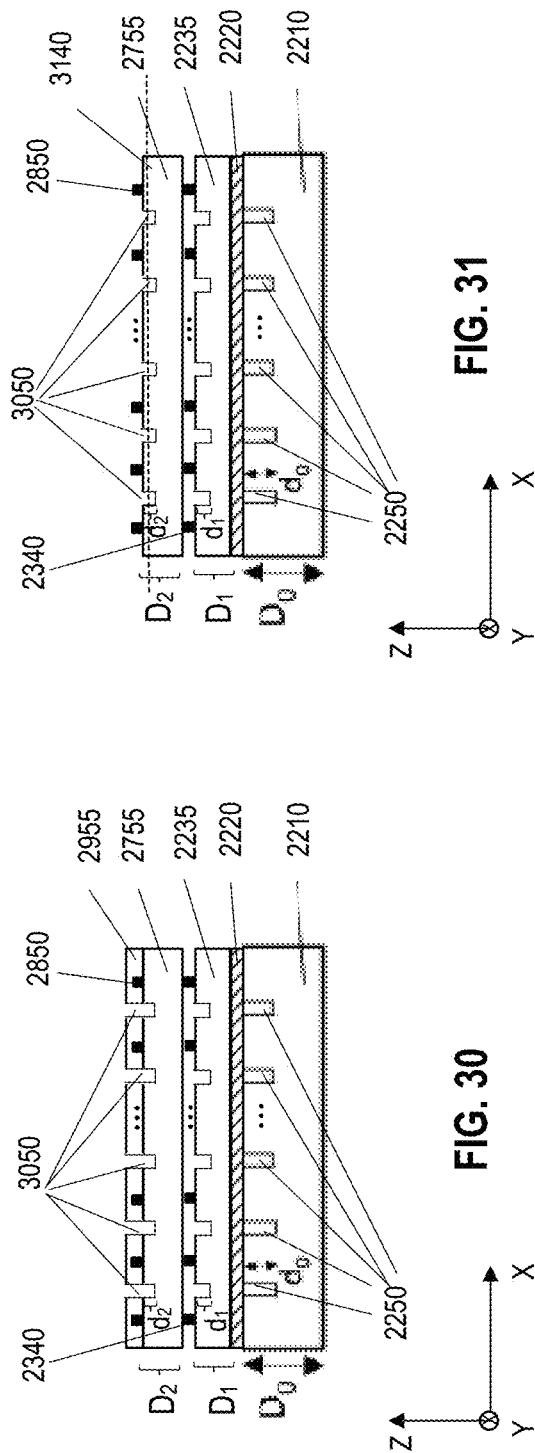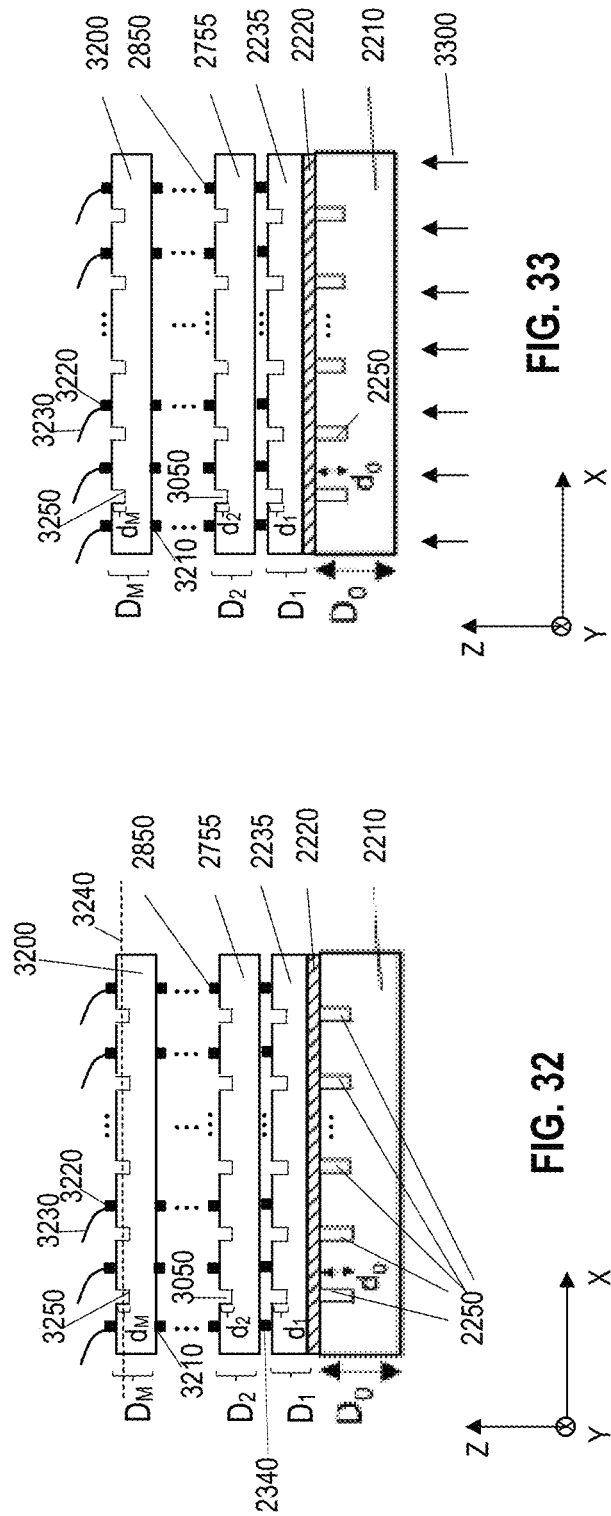

METHODS FOR MULTI-WAFER STACKING AND DICING

CROSS-REFERENCE TO RELATED APPLICATIONS

This application is continuation of International Application No. PCT/CN2020/070614, filed on Jan. 7, 2020, entitled "METHODS FOR MULTI-WAFER STACKING AND DICING," which is hereby incorporated by reference in its entirety.

BACKGROUND

Embodiments of the present disclosure relate to methods for multi-wafer stacking and dicing.

Planar integrated circuits can be reduced to smaller sizes with improved fabrication process technology. However, as the minimum feature size of the planar integrated circuits that the current fabrication capacity allows to make approaches a physical limit, the manufacturing process for producing the planar integrated circuits is becoming increasingly challenging and costly. For continuously increasing functionality density of a semiconductor device, a three-dimensional (3D) memory architecture may be employed to produce a plurality of bonded semiconductor devices by stacking a plurality of device wafers and performing a single dicing process for the stacked device wafers. The plurality of device wafers may be stacked by bonding the plurality of device wafers through bonding contacts or copper-to-copper (Cu—Cu) connections. The bonding contacts may be through-silicon vias (TSVs) or through-silicon contacts (TSCs). The plurality of bonded semiconductor devices may be further sorted and packaged to form desired semiconductor products.

SUMMARY

Embodiments of methods for multi-wafer stacking and dicing are disclosed herein.

In one example, a method includes: providing a structure including a carrier wafer, and a first device wafer with an adhesion layer between the carrier wafer and the first device wafer; and forming a plurality of first ablation structures in the structure, each of the plurality of first ablation structures extending through the first device wafer, the adhesion layer and a portion of the carrier wafer.

In another example, a method includes: providing a structure including a carrier wafer, and a first device wafer with an adhesion layer between the carrier wafer and the first device wafer; stacking a second device wafer to the first device wafer, the second device wafer having a plurality of second dies; and forming a plurality of second ablation structures in the second device wafer, each pair of adjacent second dies being separated by one of the plurality of second ablation structures.

In yet another example, a method includes: providing a carrier wafer having a plurality of innate ablation structures, each of the plurality of innate ablation structures extending through a portion of the carrier wafer; and stacking a first device wafer on the carrier wafer with an adhesion layer between the carrier wafer and the first device wafer, the first device wafer including a plurality of first dies.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 6-20 illustrate an exemplary process for stacking and dicing a plurality of device wafers to produce a plurality of bonded semiconductor devices, according to some embodiments.

FIGS. 22-36 illustrate an exemplary process for stacking and dicing a plurality of device wafers to produce a plurality of bonded semiconductor devices, according to some embodiments.

Figure 1:
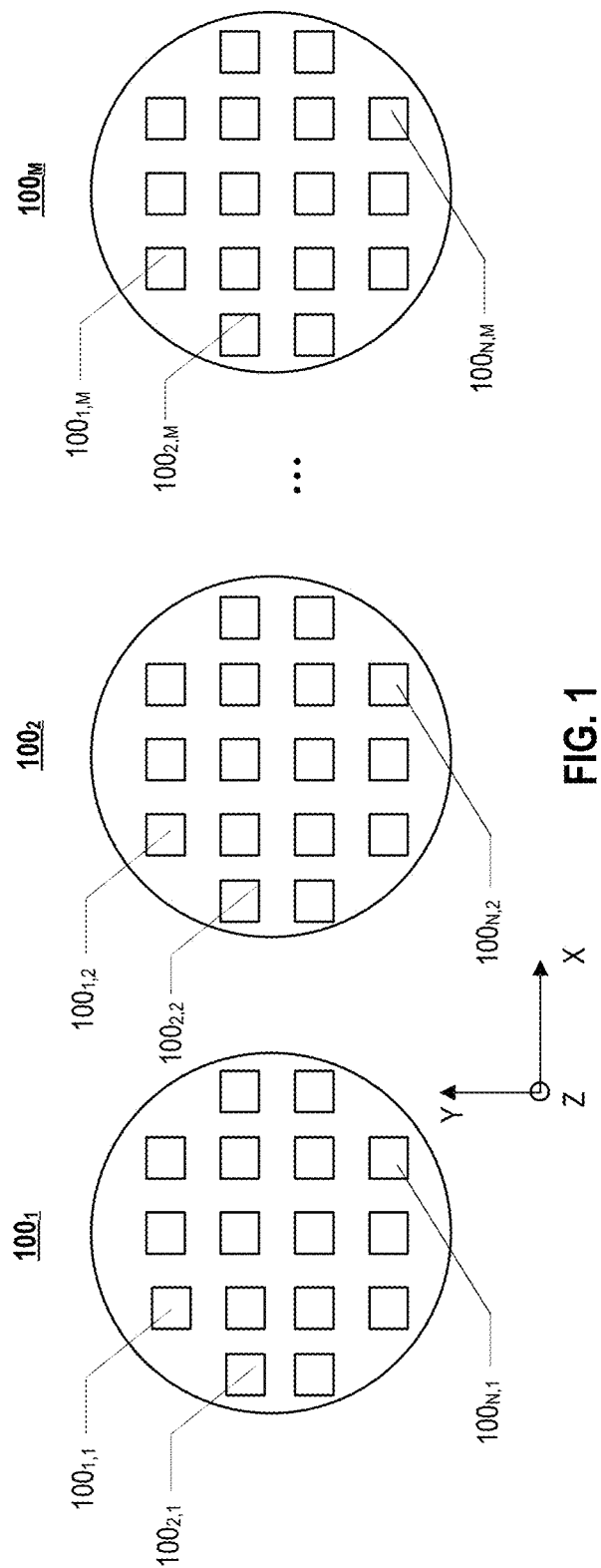
FIG. 1 illustrates a schematic top view of a plurality of device wafers for stacking and dicing to produce a plurality of bonded semiconductor devices, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "substrate," "substrate layer," and "semiconductor layer" refer to a material onto which subsequent material layers are added. The substrate itself can be patterned. Materials added on top of the substrate can be patterned or can remain not patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, a "device wafer" is a piece of a semiconductor material for semiconductor devices to build in and/or on it and that can undergo various fabrication processes before being separated into chips. As used herein, a "carrier wafer" (also known as "carrier" or "support wafer") is a type of wafer for temporary supporting structures attached onto it and that does not include any semiconductor devices or structures built therein and/or thereon. The materials of a carrier wafer can include semiconductor materials or any other suitable materials, such as glass, polymer, sapphire, $Al_2O_3$, etc.

In existing methods, a plurality of device wafers are stacked to form stacked device wafers. Bonded semiconductor devices are produced from a single dicing process on the stacked device wafers. However, the risk of damaging one or more device wafers and/or the bonded semiconductor devices during such a single dicing process in the existing methods is very high. For example, it is often observed that at least one device wafer is broken or deformed during the process of dicing all the device wafers together. This may be because of the tremendous strains and stresses within the stacked device wafers during the dicing process. In addition, the single dicing process may be performed by either mechanical sawing or laser grooving with respect to the stacked device wafers. Specifically, a mechanical sawing method often involves the usage of a mechanical saw/blade to press against the stacked device wafers sequentially. On the other hand, a laser grooving method works by carving a groove while melting/vaporizing the surfaces of the stacked device wafers sequentially or concurrently using a laser beam.

Various embodiments in accordance with the present disclosure provide methods for providing bonded semiconductor devices with significantly reduced risk of damage or deformation. Using the methods of the present disclosure, a structure including a carrier wafer and a first device wafer with an adhesion layer in between is provided. The first device wafer has a first side in contact with the adhesion layer. The first device wafer should have a thickness between 1 μm and 10 μm, and a second side which is opposite to the first side and includes a plurality of bonding contacts. Otherwise, the first device is thinned on the second side and then the plurality of bonding contacts are formed on the second side of the first device wafer. In some embodiments, each of the plurality of bonding contacts is a TSV or a TSC. A plurality of first ablation structures are formed in the structure by, for example, mechanical sawing or laser grooving. The first device wafer includes a plurality of first dies, each pair of adjacent first dies being separated by one of the plurality of first ablation structures.

In some embodiments, each of the first ablation structures extends through the first device wafer, the adhesion layer, and a portion of the carrier wafer. As such, the plurality of first dies are completely separated from each other after the formation of the first ablation structures. Further, each of the first ablation structures has a portion inside the carrier wafer with a depth no greater than one half of a thickness of the carrier wafer. A second device wafer is stacked to the first device wafer through the bonding contacts on the second side of the first device wafer and the bonding contacts on a first side of the second device wafer. The second device should have a thickness between 1 μm and 10 μm, and have a second side which is opposite to the first side and includes a plurality of bonding contacts. Otherwise, the second device is thinned on the second side of the second device wafer and then the plurality of bonding contacts are formed on the second side of the second device wafer. In some embodiments, each of the bonding contacts is a TSV or a TSC. A plurality of second ablation structures are formed in the second device wafer according to the plurality of first ablation structures by, for example, mechanical sawing or laser grooving, so that at least a majority of a cross-section of the plurality of second ablation structures overlaps with a cross-section of the plurality of first ablation structures when overlaying a cross-section of the carrier wafer having the cross-section of the plurality of first ablation structures and a cross-section of the second device wafer having the cross-section of the plurality of second ablation structures. The second device wafer includes a plurality of second dies, each pair of adjacent second dies being separated by one of the plurality of second ablation structures. Each of the plurality of second ablation structures has a depth no greater than one half of the thickness of the second ablation structures. The process of stacking and forming ablation structures repeats for each additional device wafer. Finally, a plurality of bonded semiconductor devices are separated by dicing through at least the carrier wafer, the adhesion layer, and all device wafers along planes in which the series of ablation structures are located and extend. Each of the plurality of bonded semiconductor devices includes a die from each of the device wafers.

In some embodiments, before stacked to the first device wafer, the carrier wafer includes a plurality of innate ablation structures. Each of the plurality of innate ablation structures extends through a portion of the carrier wafer. Each of the plurality of innate ablation structures has a depth no greater than one half of a thickness of the carrier wafer. In addition, the first ablation structures are formed according to the plurality of innate ablation structures by, for example without limitation, mechanical sawing or laser grooving, so that at least a majority of a cross-section of the plurality of first ablation structures overlaps with a cross-section of the plurality of innate ablation structures when overlaying a cross-section of the carrier wafer having the cross-section of the plurality of innate ablation structures and a cross-section of the first device wafer having the cross-section of the plurality of first ablation structures. Each of the first ablation structures extends through a portion of the first device wafer. Each of the first ablation structures has a depth no greater than one half of the thickness of the first device wafer. A second device wafer is stacked to the first device wafer through the bonding contacts on the second side of the first device wafer and a first side of the second device wafer. The second device should have a thickness between 1 μm and 10 μm and have a second side which is opposite to the first side and includes a plurality of bonding contacts. Otherwise, the second device is thinned on the second side of the second device wafer and then the plurality of bonding contacts are formed on the second side of the second device wafer. Each of the plurality of bonding contacts is a TSV or a TSC. A plurality of second ablation structures are formed in the second device wafer according to the plurality of innate ablation structures by, for example without limitation, mechanical sawing or laser grooving, so that at least a majority of a cross-section of the plurality of second ablation structures overlaps with a cross-section of the plurality of innate ablation structures when overlaying a cross-section of the carrier wafer having the cross-section of the plurality of innate ablation structures and a cross-section of the second device wafer having the cross-section of the plurality of second ablation structures. The second device wafer includes a plurality of second dies, each pair of adjacent second dies being separated by one of the plurality of second ablation structures. Each of the plurality of second ablation structures has a depth no greater than one half of the thickness of the second ablation structures. The process of stacking and forming ablation structures repeats for each additional device wafer. Finally, a plurality of bonded semiconductor devices are separated by dicing through at least the carrier wafer, the adhesion layer, and all device wafers along planes in which the series of ablation structures are located and extend. Each of the plurality of bonded semiconductor devices includes a die from each of the device wafers.

In some embodiments, before the plurality of bonded semiconductor devices are separated, ultraviolet radiations are provided to the adhesion layer through the carrier wafer to decrease the adhesivity of the adhesion layer by between 90% and 99%. In some embodiments, a lateral force may be applied to remove the carrier wafer and the adhesion layer before the plurality of bonded semiconductor devices are separated and provided. In some embodiments, a lateral force may be applied to remove the carrier wafer and the adhesion layer after the plurality of bonded semiconductor devices are completely separated and provided.

The disclosed methods have many advantages over existing methods. For example, by forming ablation structures on each device wafer, the strains and stresses on the device wafers are greatly reduced during the final dicing process. As a result, the risk of damaging or deforming the device wafers and/or the bonded semiconductor devices is greatly reduced. Accordingly, the yield of the bonded semiconductor devices is greatly improved. In addition, the ablation structures in each device wafer may be formed by either mechanical sawing or laser grooving. However, the width of the ablation structures may be about between 65 and 80 μm if formed by mechanical sawing and about between 25 μm and 40 μm if formed by laser grooving. Therefore, forming the ablation structures by laser grooving rather than mechanical sawing may increase the usable areas for dies in the device wafers.

Figure 2:
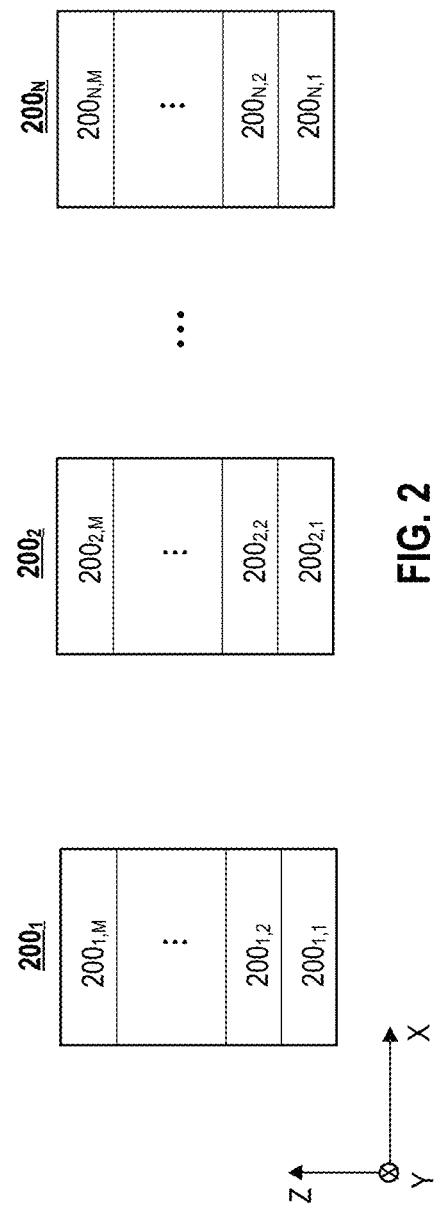
FIG. 2 illustrates a schematic cross-sectional view of a plurality of bonded semiconductor devices produced from stacking and dicing a plurality of device wafers as shown in FIG. 1, according to some embodiments.

FIG. 1 illustrates a schematic top view of a plurality of device wafers $100_1$, $100_2$, ..., $100_M$ for stacking and dicing to produce a plurality of bonded semiconductor devices $200_1$, $200_2$, ..., and $200_N$, as shown in FIG. 2, according to some embodiments. As shown in FIG. 1, each of the plurality of device wafers $100_1$, $100_2$, ..., and $100_M$ includes a plurality of dies. For example, a first device wafer $100_1$ includes N first dies (where N is an integer), denoted by $100_{1,1}$, $100_{2,1}$, . . . , and $100_{N,1}$; a second device wafer $100_2$ includes N second dies, denoted by $100_{1,2}$, $100_{2,2}$, . . . and $100_{N,2}$; . . . ; and an $M_{th}$ device wafer $100_M$ includes N $M_{th}$ dies (where M is an integer), denoted by $100_{1,M}$, $100_{2,M}$, . . . , and $100_{N,M}$.

In some embodiments, at least some of the first dies $100_{1,1}$, $100_{2,1}$, . . . , and $100_{N,1}$, the second dies $100_{1,2}$, $100_{2,2}$, . . . , and $100_{N,2}$, . . . , and the $M_{th}$ dies $100_{1,M}$, $100_{2,M}$, . . . , and $100_{N,M}$ are functional. In some embodiments, all of the first dies $100_{1,1}$, $100_{2,1}$, . . . , and $100_{N,1}$, the second dies $100_{1,2}$, $100_{2,2}$, . . . , and $100_{N,2}$, . . . , and the $M_{th}$ dies $100_{1,M}$, $100_{2,M}$, . . . , and $100_{N,M}$ are functional.

The dies of different device wafers may include different types of structures/devices. For example, each of the first dies $100_{1,1}$, $100_{2,1}$, . . . , and $100_{N,1}$ of the first device wafer $100_1$ may include a plurality of memory cells (e.g., memory stack with memory strings intersecting with conductor layers), each of the second dies of the second device wafer $100_2$ may include a plurality of circuit components (e.g., page buffers, decoders, sense amplifiers, drivers, charge pumps, current or voltage references, or any active or passive components of the circuits such as transistors, diodes, resistors, or capacitors) for controlling the operations of the memory cells, and so on.

The dies of each device wafer $100_1$, $100_2$, . . . , or $100_M$ may be placed on the device wafer $100_1$, $100_2$, . . . , or $100_M$ in any desirable pattern or distribution. In some embodiments, the dies of each device wafer $100_1$, $100_2$, . . . , or $100_M$ have a uniform distribution over the device wafer $100_1$, $100_2$, . . . , or $100_M$. In some embodiments, nominally the same distance is between each pair of adjacent dies of the device wafers $100_1$, $100_2$, . . . , or $100_M$. In some embodiments, dies of each device wafer $100_1$, $100_2$, . . . , or $100_M$ have full coverage over the device wafer $100_1$, $100_2$, . . . , or $100_M$. In some embodiments, dies of each device wafer $100_1$, $100_2$, . . . , or $100_M$ are placed on all the usable area of the device wafer $100_1$, $100_2$, . . . , or $100_M$ to increase the throughput. In some embodiments, the usable area of a device wafer $100_1$, $100_2$, . . . , or $100_M$ increases when a distance between adjacent dies of the device wafer $100_1$, $100_2$, . . . , or $100_M$ decreases.

FIG. 2 illustrates a schematic cross-sectional view of a plurality of bonded semiconductor devices $200_1$, $200_2$, . . . , and $200_N$ produced from stacking and dicing the plurality of device wafers $100_1$, $100_2$, . . . , and $100_M$ in FIG. 1, according to some embodiments. The process of producing the bonded semiconductor devices $200_1$, $200_2$, . . . , and $200_N$ will be discussed in great details below. As shown in FIG. 2, each of the plurality of bonded semiconductor devices $200_1$, $200_2$, . . . , and $200_N$ includes M dies. In some embodiments, adjacent dies included in a bonded semiconductor device $200_1$, $200_2$, . . . , or $200_N$ are bonded together. In some embodiments, each of the M dies included in a bonded semiconductor device $200_1$, $200_2$, . . . , or $200_N$ is the same as, or substantially similar to, a die of a respective one of the plurality of device wafers $100_1$, $100_2$, . . . , and $100_M$. In some embodiments, each of the M dies included in a bonded semiconductor device $200_1$, $200_2$, . . . , or $200_N$ is provided based on a die of a respective one of the plurality of device wafers $100_1$, $100_2$, . . . , and $100_M$. For example, a first bonded semiconductor device $200_1$ includes a first die $200_{1,1}$, a second die $200_{1,2}$, . . . , and an $M_{th}$ die $200_{1,M}$. In some embodiments, the first die $200_{1,1}$ is the first die $100_{1,1}$ in FIG. 1, the second die $200_{1,2}$ is the second die $100_{1,2}$ in FIG. 1, . . . , and the $M_{th}$ die $200_{1,M}$ is the $M_{th}$ die $100_{1,M}$ in FIG. 1. In some embodiments, the first die $200_{1,1}$ is provided based on the first die $100_{1,1}$ in FIG. 1, the second die $200_{1,2}$ is provided based on the second die $100_{1,2}$ in FIG. 1, . . . , and the $M_{th}$ die $200_{1,M}$ is provided based on the $M_{th}$ die $100_{1,M}$ in FIG. 1. For example, a second bonded semiconductor device $200_2$ includes a first die $200_{2,1}$, a second die $200_{2,2}$, . . . , and an $M_{th}$ die $200_{2,M}$. In some embodiments, the first die $200_{2,1}$ is the first die $100_{2,1}$ in FIG. 1, the second die $200_{2,2}$ is the second die $100_{2,2}$ in FIG. 1, . . . , and the $M_{th}$ die $200_{2,M}$ is the $M_{th}$ die $100_{2,M}$ in FIG. 1. In some embodiments, the first die $200_{2,1}$ is provided based on the first die $100_{2,1}$ in FIG. 1, the second die $200_{2,2}$ is provided based on the second die $100_{2,2}$ in FIG. 1, . . . , and the $M_{th}$ die $200_{2,M}$ is provided based on the $M_{th}$ die $100_{2,M}$ in FIG. 1. Similarly, an $N_{th}$ bonded semiconductor device $200_N$ includes a first die $200_{N,1}$, a second die $200_{N,2}$, . . . , and an $M_{th}$ die $200_{N,M}$. In some embodiments, the first die $200_{N,1}$ is the first die $100_{N,1}$ in FIG. 1, the second die $200_{N,2}$ is the second die $100_{N,2}$ in FIG. 1, . . . , and the $M_{th}$ die $200_{N,M}$ is the $M_{th}$ die $100_{N,M}$ in FIG. 1. In some embodiments, the first die $200_{N,1}$ is provided based on the first die $100_{N,1}$ in FIG. 1, the second die $200_{N,2}$ is provided based on the second die $100_{N,2}$ in FIG. 1, . . . , and the $M_{th}$ die $200_{N,M}$ is provided based on the $M_{th}$ die $100_{N,M}$ in FIG. 1.

Figure 3A:
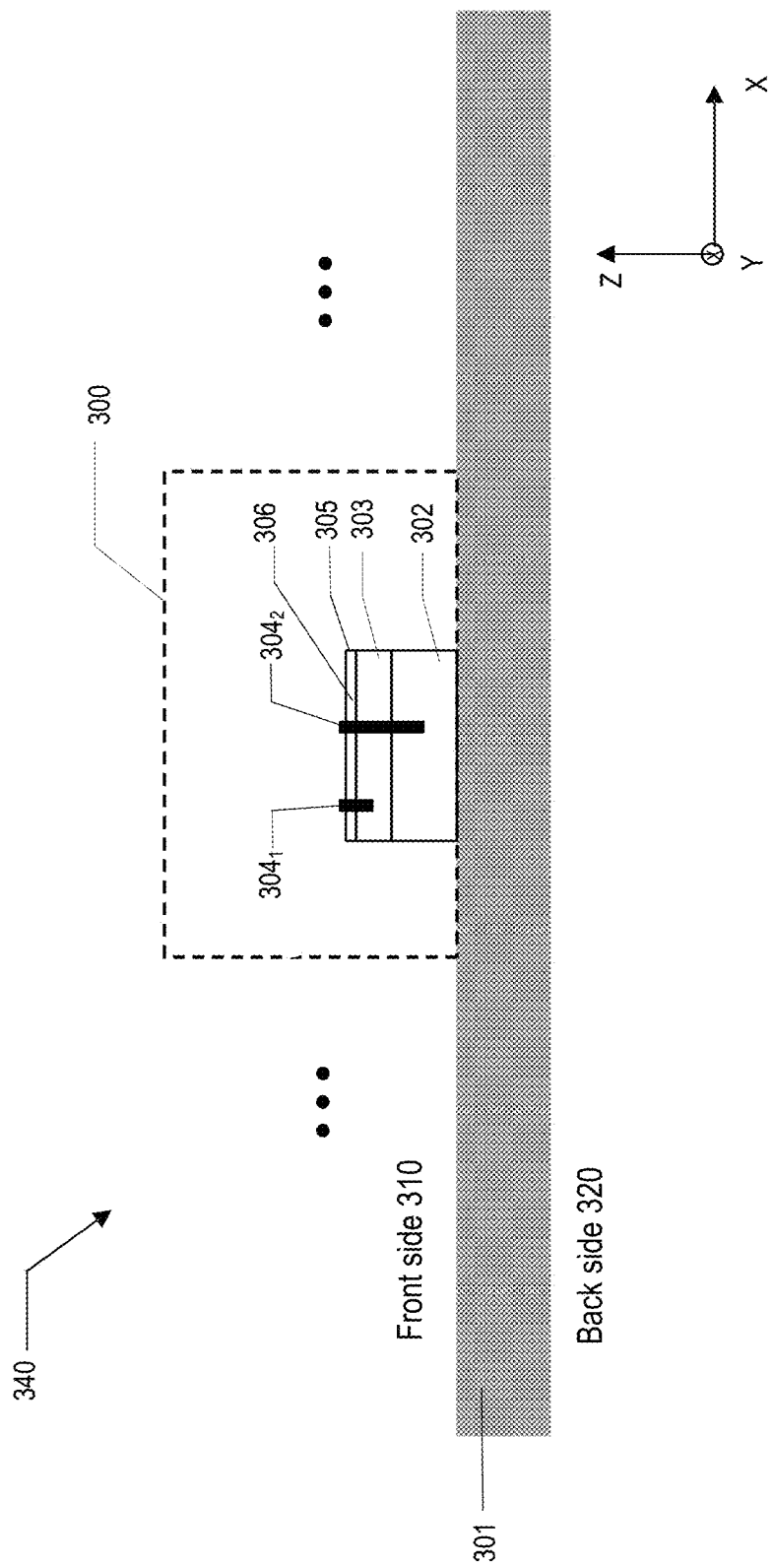
FIG. 3A illustrates a schematic cross-sectional view of a device wafer as shown in FIG. 1, according to some embodiments.

FIG. 3A illustrates a schematic cross-sectional view of a device wafer 340, according to some embodiments. As shown in FIG. 3A, the device wafer 340 includes a plurality of dies 300. In some embodiments, the device wafer 340 has a similar architecture to the device wafers $100_1$, $100_2$, . . . , and $100_M$. In some embodiments, the device wafer 340 is one of the device wafers $100_1$, $100_2$, . . . , and $100_M$. Accordingly, the dies 300 are the first dies $100_{1,1}$, $100_{2,1}$, . . . , and $100_{N,1}$ when the device wafer 340 is the first device wafer $100_1$. The dies 300 are the second dies $100_{1,2}$, $100_{2,2}$, . . . , and $100_{N,2}$ when the device wafer 340 is the second device wafer $100_2$. The dies 300 are the $M_{th}$ dies $100_{1,M}$, $100_{2,M}$, . . . , and $100_{N,M}$ when the device wafer 340 is the $M_{th}$ device wafer $100_M$. As shown in FIG. 3A, the device wafer 340 includes a substrate layer 301. In some embodiments, the substrate layer 301 includes silicon (e.g., single crystalline silicon (c-Si)), silicon germanium (SiGe), gallium arsenide (GaAs), germanium (Ge), silicon on insulator (SOI), or any other suitable materials. Each die 300 is entirely on a front side 310 of the device wafer 340. In addition, nothing is formed on the back side 320 of the device wafer 340. In some embodiments, the substrate layer 301, as shown in FIG. 3A, has a thickness greater than 10 μm. In some embodiments, the substrate layer 301 has a thickness between 1 μm and 10 μm. In some embodiments, the substrate layer 301 is also referred to as the substrate layer 301 or the semiconductor layer 301.

It is noted that X, Y and Z axes are added in FIG. 3A to further illustrate the spatial relationship of the components in the device wafer 340. The substrate layer 301 includes two lateral surfaces (e.g., a top surface and a bottom surface) extending laterally in the X-direction (the lateral direction or width direction). As used herein, whether one component (e.g., a layer or a die) is "on," "above," or "below" another component (e.g., a layer or a device) of a device wafer (e.g., the device wafer 340) is determined relative to the substrate layer (e.g., the substrate layer 301) in the Z-direction (the vertical direction or thickness direction) when the substrate layer is positioned in the lowest plane of the device wafer in the Z-direction. The same notion for describing the spatial relationship is applied throughout the present disclosure.

As shown in FIG. 3A, each die 300 includes a device layer 302, an interconnect layer 303, and a bonding layer 305. The device layer 302 may include any suitable devices/structures. In some embodiments, the device layer 302 includes a peripheral circuit (not shown) on the substrate layer 301 and an array of embedded DRAM (dynamic random-access memory) cells (not shown) on the substrate layer 301 and outside of the peripheral circuit. In some embodiments, the peripheral circuit includes a plurality of peripheral transistors forming any suitable digital, analog, and/or mixed-signal peripheral circuits used for facilitating the operation of die 300 including, but not limited to, a page buffer, a decoder (e.g., a row decoder and a column decoder), a sense amplifier, a driver, a charge pump, a current or voltage reference. The peripheral transistors can be formed on the substrate layer 301.

The interconnect layer 303 may be configured to transfer electrical signals to and from the peripheral circuit and the array of embedded DRAM cells in the device layer 302. The interconnect layer 303 may include a plurality of interconnects (also referred to herein as "contacts"), including lateral interconnect lines and vertical interconnect access (via) contacts. The interconnect lines and via contacts in the interconnect layer 303 can include conductive materials including, but not limited to, tungsten (W), cobalt (Co), copper (Cu), aluminum (Al), silicide, or any combination thereof.

The bonding layer 305 includes a plurality of bonding contacts $304_1$ and $304_2$ and dielectrics 306 electrically isolating the plurality of bonding contacts $304_1$ and $304_2$. The bonding contacts $304_1$ and $304_2$ may include conductive materials including, but not limited to, W, Co, Cu, Al, silicide, or any combination thereof. The dielectrics 306 may include, but not limited to, silicon oxide, silicon nitride, silicon oxynitride, low dielectric constant (low-k) dielectrics, or any combination thereof. The bonding contacts $304_1$ and $304_2$ may be configured to connect each die 300 with another die or another external circuit. For example, the bonding contact $304_1$ may be configured to connect the interconnect layer 303 of the die 300 to another die or another external circuit, as the bonding contact $304_2$ may be configured to connect the device layer 302 of the die 300 to another die or another external circuit. The bonding contacts $304_1$ and $304_2$ and the surrounding dielectrics 306 in the bonding layer 305 can be used for hybrid bonding. It should be noted that the dies 300 in FIG. 3A are shown only for illustrative purposes. Although each die 300 includes two bonding contacts $304_1$ and $304_2$ in the front side 310 of the device wafer 340 as shown in FIG. 3A, the number of bonding contacts included on the front side 310 of the device wafer 340 is non-limiting.

Figure 3B:
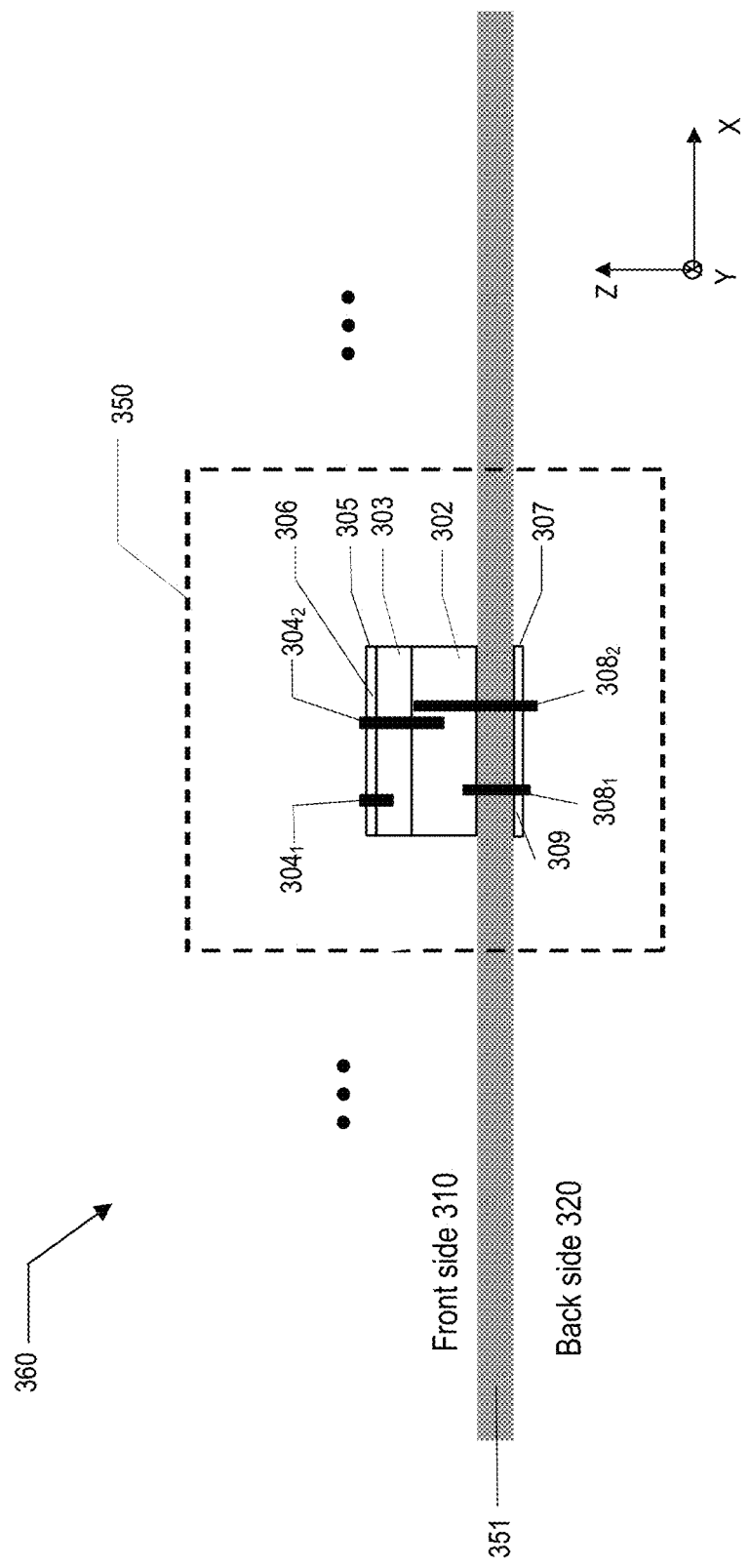
FIG. 3B illustrates a schematic cross-sectional view of a device wafer as shown in FIG. 1, according to some embodiments.

FIG. 3B illustrates a schematic cross-sectional view of a device wafer 360, according to some embodiments. As shown in FIG. 3B, the device wafer 360 includes a plurality of dies 350. In some embodiments, the dies 350 have similar architectures to, or the same architectures as, the first dies $200_{1,1}$, $200_{1,2}$, . . . , and $200_{1,M}$, the second dies $200_{2,1}$, $200_{2,2}$, . . . , and $200_{2,M}$, . . . , or the $M_{th}$ dies $200_{N,1}$, $200_{N,2}$, . . . , and $200_{N,M}$. In some embodiments, the dies 350 are the first dies $200_{1,1}$, $200_{1,2}$, . . . , and $200_{1,M}$, the second dies $200_{2,1}$, $200_{2,2}$, . . . , and $200_{2,M}$, . . . , or the $M_{th}$ dies $200_{N,1}$, $200_{N,2}$, . . . , and $200_{N,M}$. In some embodiments, the device wafer 360 has a similar architecture to the device wafers $100_1$, $100_2$, . . . , and $100_M$. In some embodiments, the device wafer 360 is one of the device wafers $100_1$, $100_2$, . . . , and $100_M$. Accordingly, the dies 350 are the first dies $100_{1,1}$, $100_{2,1}$, . . . , and $100_{N,1}$ in FIG. 1 and the first dies $200_{1,1}$, $200_{2,1}$, . . . , and $200_{N,1}$ in FIG. 2 when the device wafer 360 is the first device wafer $100_1$. The dies 350 are the second dies $100_{1,2}$, $100_{2,2}$, . . . , and $100_{N,2}$ in FIG. 1 and the second dies $200_{1,2}$, $200_{2,2}$, . . . , and $200_{N,2}$ in FIG. 2 when the device wafer 360 is the second device wafer $100_2$. Each die 350 is the $M_{th}$ dies $100_{1,M}$, $100_{2,M}$, . . . , and $100_{N,M}$ in FIG. 1 and the $M_{th}$ dies $200_{1,M}$, $200_{2,M}$, . . . , and $200_{N,M}$ in FIG. 2 when the device wafer 360 is the $M_{th}$ device wafer $100_M$.

Similar to the substrate layer 301 in FIG. 3A, the substrate layer 351 of the device wafer 360 in FIG. 3B includes silicon (e.g., c-Si), SiGe, GaAs, Ge, SOL or any other suitable materials. Different than dies 300, each die 350 includes a portion of the substrate layer 351 below the device layer 302. In addition, the substrate layer 351 has a thickness between 1 μm and 10 μm. Further, each die 350 includes a second bonding layer 307 on the back side 320 of the device wafer 360 and attached to the substrate layer 351.

The second bonding layer 307 includes a plurality of bonding contacts $308_1$ and $308_2$ and dielectrics 309 electrically isolating the plurality of bonding contacts $308_1$ and $308_2$. The bonding contacts $308_1$ and $308_2$ may include conductive materials including, but not limited to, W, Co, Cu, Al, silicide, or any combination thereof. The dielectrics 309 may include, but not limited to, silicon oxide, silicon nitride, silicon oxynitride, low-k dielectrics, or any combination thereof. The bonding contacts $308_1$ and $308_2$ may be configured to connect each die 350 with another die or another external circuit. For example, the bonding contact $308_1$ may be configured to connect the device layer 302 of the die 350 to another die or another external circuit, as the bonding contact $308_2$ may be configured to connect the interconnect layer 303 of the die 350 to another die or another external circuit. The bonding contacts $308_1$ and $308_2$ and the surrounding dielectrics 309 in the second bonding layer 307 can be used for hybrid bonding. It should be noted that the dies 350 in FIG. 3B are shown only for illustrative purposes. Although each die 350 includes two bonding contacts $304_1$, $304_2$ in the front side 310 of the device wafer 360 and two bonding contacts $308_1$ and $308_2$ in the back side of the device wafer 360 as shown in FIG. 3B, the number of bonding contacts included on either side of the device wafer 360 is non-limiting. Sometimes, the front side 310 of the device wafer 360 is also referred to as the front side 310 of the die 350, as the back side 320 of the device wafer 360 is also referred to as the back side 320 of the die 350. Sometimes, the front side 310 of the device wafer 360 is also referred to as the front side 310 of the substrate layer 351, as the back side 320 of the device wafer 360 is also referred to as the back side 320 of the substrate layer 351.

In some embodiments, the dies 350 may be provided based on the dies 300 by processing the device wafer 340 to be the device wafer 360. For example, when the substrate layer 301 has a thickness greater than 10 μm, the device wafer 340 can be thinned on the back side 320 of the device wafer 340 (for example without limitation, by a planarization process) until the thickness of the substrate layer 301 is within 1 μm and 10 μm. Then the plurality of bonding contacts $308_1$ and $308_2$ can be formed on the backside of the device wafer 340. This is done so that the dies 350 in FIG. 3B can be provided based on the dies 300 in FIG. 3A, as the device wafer 360 in FIG. 3B is provided based on the device wafer 340 in FIG. 3A.

Figure 4:
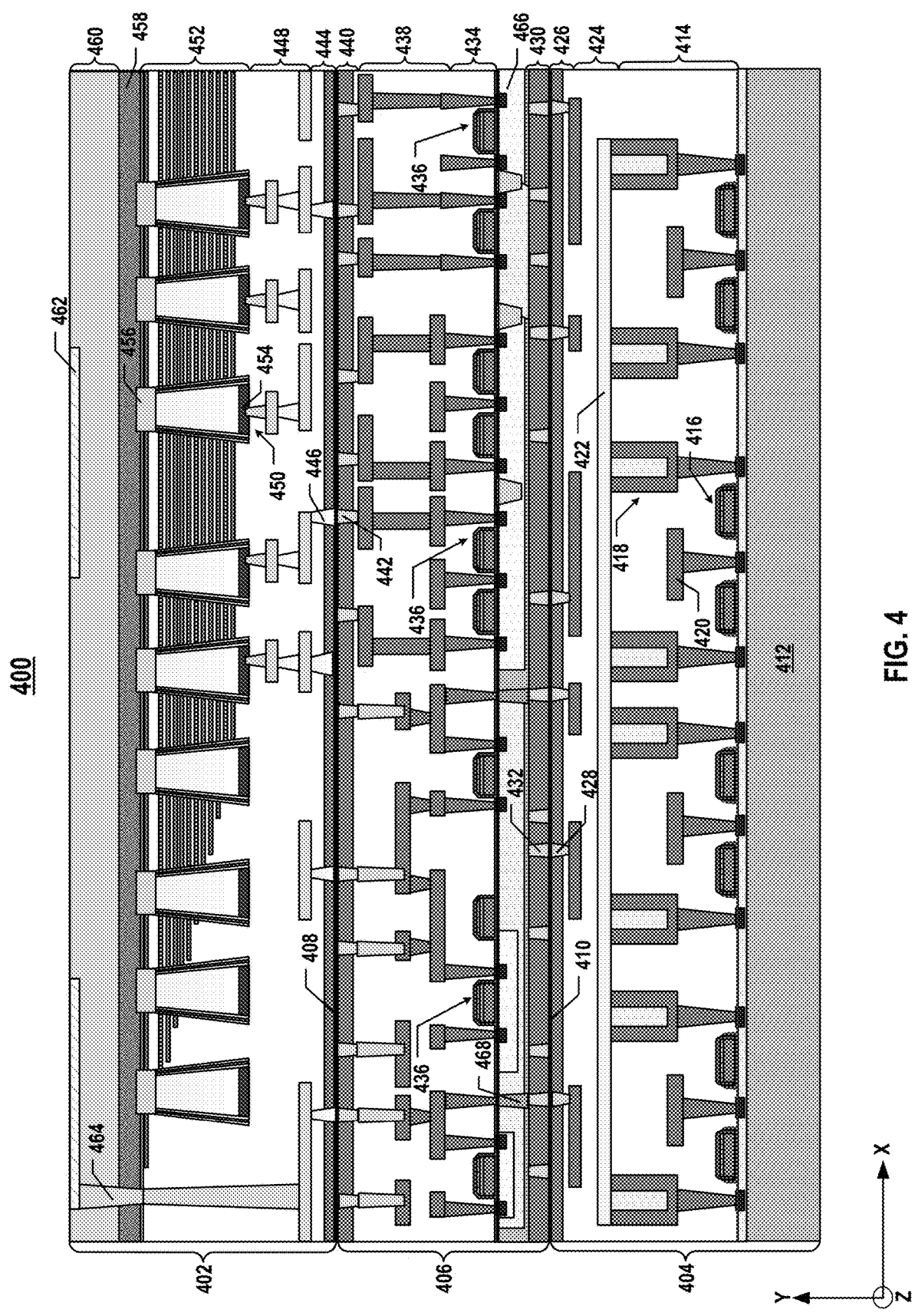
FIG. 4 illustrates a schematic cross-sectional view of an exemplary bonded semiconductor device as shown in FIG. 2, according to some embodiments.

FIG. 4 illustrates a cross-sectional view of an exemplary bonded semiconductor device 400, according to some embodiments. In some embodiments, the exemplary bonded semiconductor device 400 is one of the bonded semiconductor devices $200_1$, $200_2$, . . . , and $200_N$. In some embodiments, bonded semiconductor device 400 may also be referred to as a 3D memory device. As one example of the bonded semiconductor devices $200_1$, $200_2$, . . . , and $200_N$ described above with respect to FIG. 2, the bonded semiconductor device 400 is a bonded chip including a first die 402, a second die 404 below first die 402, and a third die 406 vertically between first and second dies 402 and 404. First and third dies 402 and 406 are joined at a first bonding interface 408 therebetween, according to some embodiments. Second and third dies 404 and 406 are joined at a second bonding interface 410 therebetween, according to some embodiments. First bonding interface 408 is above second bonding interface 410, i.e., in different planes, according to some embodiments. As shown in FIG. 4, second die 404 can include a substrate 412, which can include silicon (e.g., c-Si), SiGe, GaAs, Ge, SOI, or any other suitable materials. It should be noted that bonded semiconductor device 400 is shown only for illustrative purposes. Although bonded semiconductor device 400 includes only three dies (i.e., first die 402, second die 404, and third die 406) in FIG. 3A, the number of dies included in the bonded semiconductor device 400 is non-limiting.

Second die 404 of bonded semiconductor device 400 can include an array of DRAM cells 414 above substrate 412. It is noted that X- and Y-axes are added in FIG. 4 to further illustrate the spatial relationship of the components in bonded semiconductor device 400. Substrate 412 includes two lateral surfaces (e.g., a top surface and a bottom surface) extending laterally in the X-direction (the lateral direction or width direction). As used herein, whether one component (e.g., a layer or a device) is "on," "above," or "below" another component (e.g., a layer or a device) of a semiconductor device (e.g., bonded semiconductor device 400) is determined relative to the substrate of the semiconductor device (e.g., substrate 412) in the Y-direction (the vertical direction or thickness direction) when the substrate is positioned in the lowest plane of the semiconductor device in the Y-direction. The same notion for describing the spatial relationship is applied throughout the present disclosure.

In some embodiments, each DRAM cell 414 includes a DRAM selection transistor 416 and a capacitor 418. DRAM cell 414 can be a 1T1C cell consisting of one transistor and one capacitor. It is understood that DRAM cell 414 may be of any suitable configuration, such as 2T1C cell, 3T1C cell, etc. In some embodiments, DRAM selection transistors 416 are formed "on" substrate 412, in which the entirety or part of DRAM selection transistors 416 are formed in substrate 412 and/or directly on substrate 412. Isolation regions (e.g., shallow trench isolations (STIs)) and doped regions (e.g., the source regions and drain of DRAM selection transistors 416) can be formed in substrate 412 as well. In some embodiments, capacitors 418 are disposed above DRAM selection transistors 416. Each capacitor 418 includes two electrodes, one of which is electrically connected to one node of respective DRAM selection transistor 416, according to some embodiments. Another node of each DRAM selection transistor 416 is electrically connected to a bit line 420 of DRAM, according to some embodiments. Another electrode of each capacitor 418 can be electrically connected to a common plate 422, e.g., a common ground. It is understood that the structure and configuration of DRAM cell 414 are not limited to the example in FIG. 4 and may include any suitable structure and configuration.

In some embodiments, second die 404 of bonded semiconductor device 400 further includes an interconnect layer 424 above array of DRAM cells 414 to transfer electrical signals to and from array of DRAM cells 414. Interconnect layer 424 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 424 can further include one or more interlayer dielectric (ILD) layers (also known as "intermetal dielectric (IMD) layers") in which the interconnect lines and via contacts can form. That is, interconnect layer 424 can include interconnect lines and via contacts in multiple ILD layers. The interconnect lines and via contacts in interconnect layer 424 can include conductive materials including, but not limited to, W, Co, Cu, Al, silicide, or any combination thereof. The ILD layers in interconnect layer 424 can include dielectric materials including, but not limited to, silicon oxide, silicon nitride, silicon oxynitride, low-k dielectrics, or any combination thereof.

As shown in FIG. 4, second die 404 of bonded semiconductor device 400 can further include a bonding layer 426 at second bonding interface 410 and above interconnect layer 424 and array of DRAM cells 414. Bonding layer 426 can include a plurality of bonding contacts 428 and dielectrics electrically isolating bonding contacts 428. Bonding contacts 428 can include conductive materials including, but not limited to, W, Co, Cu, Al, silicide, or any combination thereof. The remaining area of bonding layer 426 can be formed with dielectrics including, but not limited to, silicon oxide, silicon nitride, silicon oxynitride, low-k dielectrics, or any combination thereof. Bonding contacts 428 and surrounding dielectrics in bonding layer 426 can be used for hybrid bonding.

Similarly, as shown in FIG. 4, third die 406 of bonded semiconductor device 400 can also include a bonding layer 430 at second bonding interface 410 and above bonding layer 426 of second die 404. Bonding layer 430 can include a plurality of bonding contacts 432 and dielectrics electrically isolating bonding contacts 432. Bonding contacts 432 can include conductive materials including, but not limited to, W, Co, Cu, Al, silicide, or any combination thereof. The remaining area of bonding layer 430 can be formed with dielectrics including, but not limited to, silicon oxide, silicon nitride, silicon oxynitride, low-k dielectrics, or any combination thereof. Bonding contacts 432 and surrounding dielectrics in bonding layer 430 can be used for hybrid bonding. Bonding contacts 432 are in contact with bonding contacts 428 at second bonding interface 410, according to some embodiments.

As described below in detail, third die 406 can be bonded on top of second die 404 in a face-to-face manner at second bonding interface 410. In some embodiments, second bonding interface 410 is disposed between bonding layers 430 and 426 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, second bonding interface 410 is the place at which bonding layers 430 and 426 are met and bonded. In practice, second bonding interface 410 can be a layer with a certain thickness that includes part of the top surface of bonding layer 426 of second die 404 and the bottom surface of bonding layer 430 of third die 406.

As shown in FIG. 4, third die 406 can include a semiconductor layer 466 disposed above bonding layer 430. Semiconductor layer 466 can be a thinned substrate on which an array of SRAM cells 434 is formed. In some embodiments, semiconductor layer 466 includes single-crystal silicon. Semiconductor layer 466 can also include isolation regions (e.g., STIs) and doped regions (e.g., sources and drains of transistors 436 forming array of SRAM cells 434).

Third die 406 of bonded semiconductor device 400 can also include array of SRAM cells 434 above and in contact with semiconductor layer 466. In some embodiments, a peripheral circuit is also formed above and in contact with semiconductor layer 466, i.e., in the same plane as array of SRAM cells 434. For example, the peripheral circuit may be part or the entirety of the peripheral circuits for controlling and sensing the NAND memory, DRAM, and/or SRAM of bonded semiconductor device 400. In some embodiments, transistors 436 form an array of SRAM cells 434 used as, for example, cache and/or data buffer of bonded semiconductor device 400. In some embodiments, transistors 436 also form the peripheral circuit, i.e., any suitable digital, analog, and/or mixed-signal control and sensing circuits used for facilitating the operation of the NAND memory, DRAM, and/or SRAM including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors, etc.). Transistors 436 can be formed "on" semiconductor layer 466, in which the entirety or part of transistors 436 are formed in semiconductor layer 466 (e.g., below the top surface of semiconductor layer 466) and/or directly on semiconductor layer 466. Transistors 436 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, third die 406 of bonded semiconductor device 400 further includes an interconnect layer 438 above array of SRAM cells 434 to transfer electrical signals to and from array of SRAM cells 434. Interconnect layer 438 can include a plurality of interconnects, such as MEOL interconnects and BEOL interconnects. In some embodiments, the interconnects in interconnect layer 438 also include local interconnects, such as bit line contacts and word line contacts. Interconnect layer 438 can further include one or more ILD layers in which the interconnect lines and via contacts can form. The interconnect lines and via contacts in interconnect layer 438 can include conductive materials including, but not limited to, W, Co, Cu, Al, silicide, or any combination thereof. The ILD layers in interconnect layer 438 can include dielectric materials including, but not limited to, silicon oxide, silicon nitride, silicon oxynitride, low-k dielectrics, or any combination thereof.

As shown in FIG. 4, third die 406 of bonded semiconductor device 400 can further include another bonding layer 440 at first bonding interface 408 and above interconnect layer 438 and array of SRAM cells 434. That is, third die 406 includes two bonding layers 430 and 440 on both sides of array of SRAM cells 434, according to some embodiments. For example, bonding layer 440 may be formed on the front side of third die 406, and bonding layer 430 may be formed on the backside of third die 406. Bonding layer 440 can include a plurality of bonding contacts 442 and dielectrics electrically isolating bonding contacts 442. Bonding contacts 442 can include conductive materials including, but not limited to, W, Co, Cu, Al, silicide, or any combination thereof. The remaining area of bonding layer 440 can be formed with dielectrics including, but not limited to, silicon oxide, silicon nitride, silicon oxynitride, low-k dielectrics, or any combination thereof. Bonding contacts 442 and surrounding dielectrics in bonding layer 440 can be used for hybrid bonding.

Similarly, as shown in FIG. 4, first die 402 of bonded semiconductor device 400 can also include a bonding layer 444 at first bonding interface 408 and above bonding layer 440 of third die 406. Bonding layer 444 can include a plurality of bonding contacts 446 and dielectrics electrically isolating bonding contacts 446. Bonding contacts 446 can include conductive materials including, but not limited to, W, Co, Cu, Al, silicide, or any combination thereof. The remaining area of bonding layer 444 can be formed with dielectrics including, but not limited to, silicon oxide, silicon nitride, silicon oxynitride, low-k dielectrics, or any combination thereof. Bonding contacts 446 and surrounding dielectrics in bonding layer 444 can be used for hybrid bonding. Bonding contacts 446 are in contact with bonding contacts 442 at first bonding interface 408 according to some embodiments.

As described below in detail, first die 402 can be bonded on top of third die 406 in a face-to-face manner at first bonding interface 408. In some embodiments, first bonding interface 408 is disposed between bonding layers 444 and 440 as a result of hybrid bonding. In some embodiments, first bonding interface 408 is the place at which bonding layers 444 and 440 are met and bonded. In practice, first bonding interface 408 can be a layer with a certain thickness that includes part of the top surface of bonding layer 440 of third die 406 and the bottom surface of bonding layer 444 of first die 402.

In some embodiments, first die 402 of bonded semiconductor device 400 further includes an interconnect layer 448 above bonding layer 444 to transfer electrical signals. Interconnect layer 448 can include a plurality of interconnects, such as MEOL interconnects and BEOL interconnects. In some embodiments, interconnects in interconnect layer 448 also include local interconnects, such as bit line contacts and word line contacts. Interconnect layer 448 can further include one or more ILD layers in which the interconnect lines and via contacts can form. The interconnect lines and via contacts in interconnect layer 448 can include conductive materials including, but not limited to, W, Co, Cu, Al, silicide, or any combination thereof. The ILD layers in interconnect layer 448 can include dielectric materials including, but not limited to, silicon oxide, silicon nitride, silicon oxynitride, low-k dielectrics, or any combination thereof.

As shown in FIG. 4, first die 402 of bonded semiconductor device 400 includes a NAND flash memory device in which memory cells are provided in the form of an array of 3D NAND memory strings 450 above interconnect layer 448 and bonding layer 444. Each 3D NAND memory string 450 extends vertically through a plurality of pairs each including a conductor layer and a dielectric layer, according to some embodiments. The stacked and interleaved conductor layers and dielectric layer are also referred to herein as a memory stack 452. The interleaved conductor layers and dielectric layers in memory stack 452 alternate in the vertical direction, according to some embodiments. In other words, except the ones at the top or bottom of memory stack 452, each conductor layer can be adjoined by two dielectric layers on both sides, and each dielectric layer can be adjoined by two conductor layers on both sides. The conductor layers can each have the same thickness or different thicknesses. Similarly, the dielectric layers can each have the same thickness or different thicknesses. The conductor layers can include conductor materials including, but not limited to, W, Co, Cu, Al, doped silicon, silicide, or any combination thereof. The dielectric layers can include dielectric materials including, but not limited to, silicon oxide, silicon nitride, silicon oxynitride, or any combination thereof.

In some embodiments, each 3D NAND memory string 450 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string 450 can have a cylinder shape (e.g., a pillar shape). The semiconductor channel, tunneling layer, storage layer, and blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 450 further include a plurality of control gates (each being part of a word line). Each conductor layer in memory stack 452 can act as a control gate for each memory cell of 3D NAND memory string 450. In some embodiments, each 3D NAND memory string 450 includes two plugs 456 and 454 at a respective end in the vertical direction. Plug 456 can include a semiconductor material, such as single-crystal silicon, that is epitaxially grown from a semiconductor layer 458. Plug 456 can function as the controller of the source select gate of 3D NAND memory string 450. Plug 456 can be at the upper end of 3D NAND memory string 450 and in contact with semiconductor layer 458. As used herein, the "upper end" of a component (e.g., 3D NAND memory string 450) is the end farther away from substrate 412 in the Y-direction, and the "lower end" of the component (e.g., 3D NAND memory string 450) is the end closer to substrate 412 in the Y-direction when substrate 412 is positioned in the lowest plane of bonded semiconductor device 400. Another plug 454 can include semiconductor materials (e.g., polysilicon). In some embodiments, plug 454 functions as the drain of 3D NAND memory string 450.

In some embodiments, first die 402 further includes semiconductor layer 458 disposed above memory stack 452 and 3D NAND memory strings 450. Semiconductor layer 458 can be a thinned substrate on which memory stack 452 and 3D NAND memory strings 450 are formed. In some embodiments, semiconductor layer 458 includes single-crystal silicon from which plugs 456 can be epitaxially grown. In some embodiments, semiconductor layer 458 can include polysilicon, amorphous silicon, SiGe, GaAs, Ge, or any other suitable materials. Semiconductor layer 458 can also include isolation regions (e.g., STIs) and doped regions (e.g., functioning as an array common source (ACS) for 3D NAND memory strings 450, not shown). Isolation regions (not shown) can extend across the entire thickness or part of the thickness of semiconductor layer 458 to electrically isolate the doped regions. In some embodiments, a pad oxide layer including silicon oxide is disposed between memory stack 452 and semiconductor layer 458.

It is understood that 3D NAND memory strings 450 are not limited to the "charge trap" type of 3D NAND memory strings and may be "floating gate" type of 3D NAND memory strings in other embodiments. It is also understood that memory stack 452 is not limited to having the single-deck structure but also can have a multiple-deck structure with inter-deck plugs among different decks for electrical connections of 3D NAND memory strings 450. Semiconductor layer 458 may include polysilicon as the source plate of the "floating gate" type of 3D NAND memory strings.

As shown in FIG. 4, first die 402 of bonded semiconductor device 400 can further include a pad-out interconnect layer 460 above semiconductor layer 458. Pad-out interconnect layer 460 can include interconnects, e.g., contact pads 462, in one or more ILD layers. Pad-out interconnect layer 460 and interconnect layer 448 can be formed on both sides of semiconductor layer 458. In some embodiments, interconnects in pad-out interconnect layer 460 can transfer electrical signals between bonded semiconductor device 400 and outside circuits, e.g., for pad-out purposes.

In some embodiments, first die 402 further includes one or more contacts 464 extending through semiconductor layer 458 to electrically connect pad-out interconnect layer 460 and interconnect layer 448. Similarly, in some embodiments, third die 406 further includes one or more contacts 468 extending through semiconductor layer 466 to electrically connect interconnect layer 438 in third die 406 and interconnect layer 424 in second die 404. As a result, array of SRAM cells 434 (and the peripheral circuit if any) can be electrically connected to array of 3D NAND memory strings 450 through interconnect layers 438 and 448 as well as bonding contacts 442 and 446. Array of SRAM cells 434 (and the peripheral circuit if any) can be electrically connected to array of DRAM cells 414 through contacts 468, interconnect layer 424, as well as bonding contacts 432 and 428. Array of 3D NAND memory strings 450 can be electrically connected to array of DRAM cells 414 through contacts 468, interconnect layers 448, 438, and 424, as well as bonding contacts 446, 442, 432, and 428. Moreover, array of SRAM cells 434, array of 3D NAND memory strings 450, and array of DRAM cells 414 can be electrically connected to outside circuits through contacts 464 and pad-out interconnect layer 460.

Figure 5:
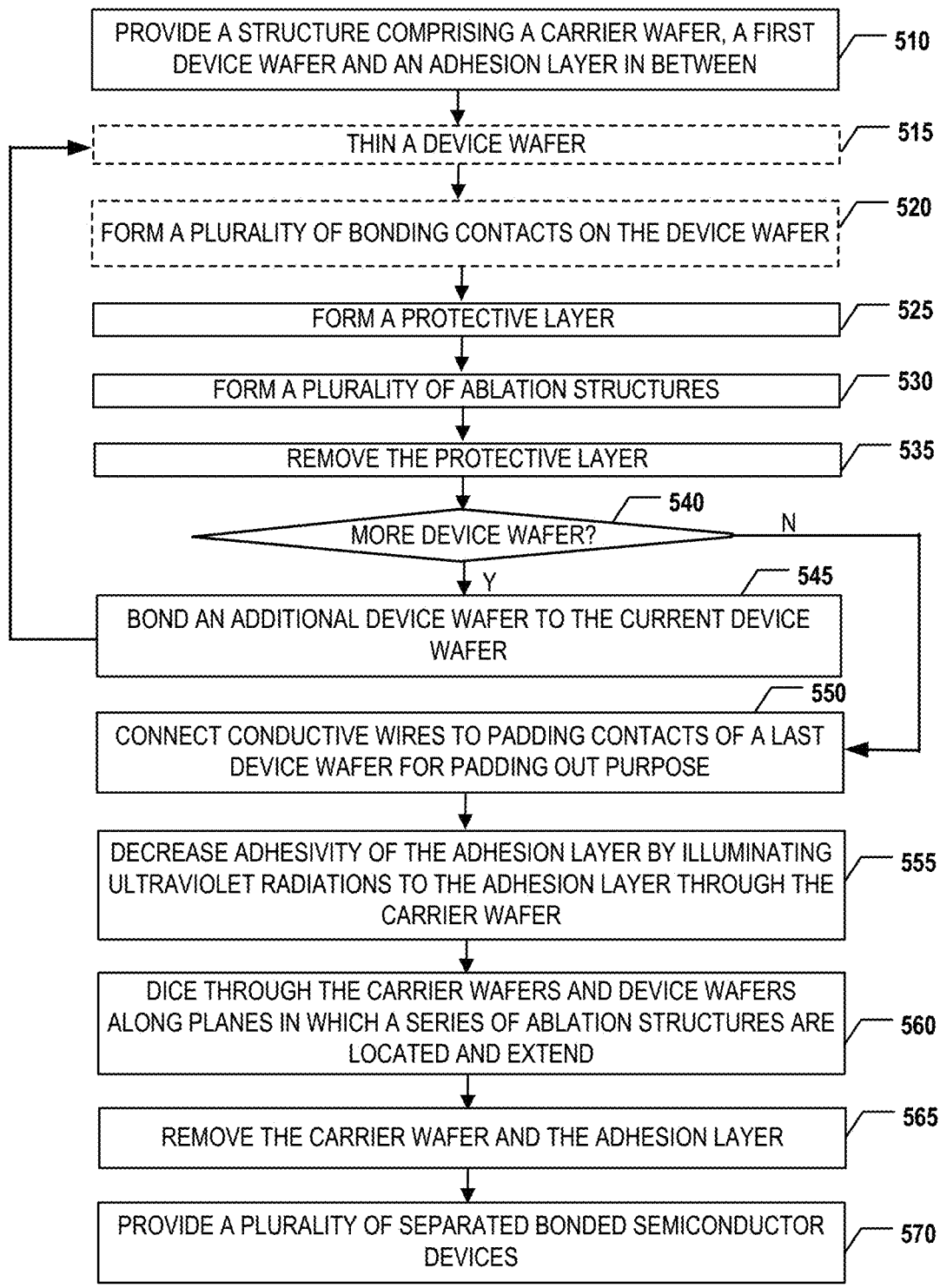
FIG. 5 is a flowchart of an exemplary method for stacking and dicing a plurality of device wafers to produce a plurality of bonded semiconductor devices, according to some embodiments.

FIG. 5 is a flowchart of an exemplary method 500 for stacking and dicing a plurality of device wafers to produce a plurality of bonded semiconductor devices, according to some embodiments. It is understood that the operations shown in method 500 are not exhaustive and that other operations can be performed as well before, after, or between any of the illustrated operations. Further, some of the operations may be performed simultaneously, or in a different order than shown in FIG. 5. FIGS. 6-20 illustrate an exemplary process for implementing method 500 in FIG. 5, according to some embodiments. For ease of illustration, method 500 is described in view of the process shown in FIGS. 6-20.

Figure 6:
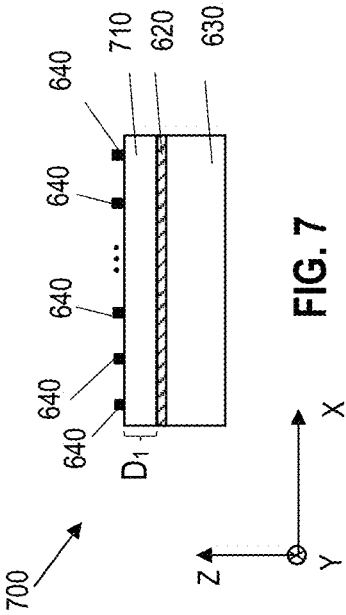
Figure 7:
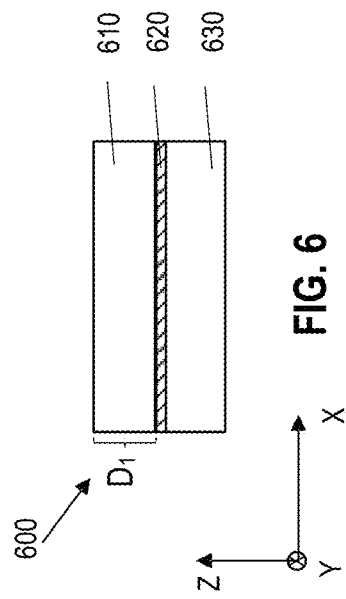

Referring to FIG. 5, method 500 starts at operation 510, as illustrated in FIGS. 6 and 7, in which a structure including a carrier wafer, a first device wafer and an adhesion layer in between is provided. In some embodiments, the first device wafer may be the first device wafer $100_1$ in FIG. 1. In some embodiments, the adhesion layer may be formed by any suitable process such as deposition and/or spinning on an adhesive onto the carrier wafer and/or the first device wafer.

Alternatively or in addition, the adhesion layer may be first applied to a first side of the first device wafer when the first side of the first device wafer faces up. Then the first device wafer with the adhesion layer on top is flipped upside down and finally stacked to the carrier wafer.

In some embodiments, the structure provided at operation 510 is the structure 700 in FIG. 7. The structure 700 includes a carrier wafer 630, a first device wafer 710, and an adhesion layer 620 between the carrier wafer 630 and the first device wafer 710. In some embodiments, the adhesion layer 620 includes a layer of ultraviolet (UV) glue. The first device wafer 710 has an architecture similar to the device wafer 360 in FIG. 3B. The first device wafer 710 includes a first side of the first device wafer 710 in contact with the adhesion layer 620. In addition, the first device wafer 710 includes a second side of the first device wafer 710 having a plurality of bonding contacts 640. In some embodiments, the first side of the first device wafer 710 is opposite to the second side of the first device wafer 710. In some embodiments, the first device wafer 710 has a thickness between 1 μm and 10 μm. In some embodiments, the first side of the first device wafer 710 is a front side of the first device wafer 710, and the second side of the first device wafer 710 is a back side of the first device wafer 710. In some embodiments, the first side of the first device wafer 710 is the back side of the first device wafer 710, and the second side of the first device wafer 710 is the front side of the first device wafer 710. After operation 510 is completed, method 500 skips operations 515 and 520 and proceeds to operation 525, which will be described in further details.

In some embodiments, the structure provided at operation 510 is the structure 600 in FIG. 6. The structure 600 includes the carrier wafer 630, the first device wafer 610, and the adhesion layer 620 between the carrier wafer 630 and the first device wafer 610. In some embodiments, the first device wafer 610 has an architecture similar to the device wafer 340 in FIG. 3A. In some embodiments, the first device wafer 610 is the device wafer 340 in FIG. 3A. In some embodiments, the first device wafer 610 includes a front side of the first device wafer 610 in contact with the adhesion layer 620. In addition, the first device wafer 610 includes no bonding contacts on the back side of the first device wafer 610 as shown in FIG. 6. In some embodiments, the first device wafer 610 has a thickness greater than 10 μm.

Method 500 proceeds to operation 515, as illustrated in FIG. 7, in which a device wafer is thinned. As shown in FIG. 7, the first device wafer 610 is thinned Specifically, the back side of the first device wafer 610 is thinned by any suitable planarization process (e.g., chemical mechanical planarization and/or recess etching) until the thickness of the first device wafer 610, denoted by $D_1$, is between 1 μm and 10 μm. This is done so that the first device wafer 610 in FIG. 6 is processed to be the first device wafer 710 in FIG. 7.

Method 500 proceeds to operation 520, as illustrated in FIG. 7, in which a plurality of bonding contacts are formed on the device wafer. As shown in FIG. 7, the plurality of bonding contacts 640 are formed on the first device wafer 710. Specifically, the plurality of bonding contacts 640 are formed on the back side of the first device wafer 710. In some embodiments, a dielectric layer is formed on the back side of the first device wafer 710 before the plurality of bonding contacts 640 is formed. This is done so that the plurality of bonding contacts 640 can be isolated electrically by dielectrics. In some embodiments, the plurality of bonding contacts 640 are formed through the dielectric layer and in contact with the interconnect layer by first patterning contact holes through the dielectric layer using a patterning process (e.g., photolithography and dry/wet etch of dielectric materials in the dielectric layer). The contact holes can be filled with a conductor (e.g., copper). In some embodiments, each of the plurality of bonding contacts 640 is a TSV or a TSC.

Figure 8:
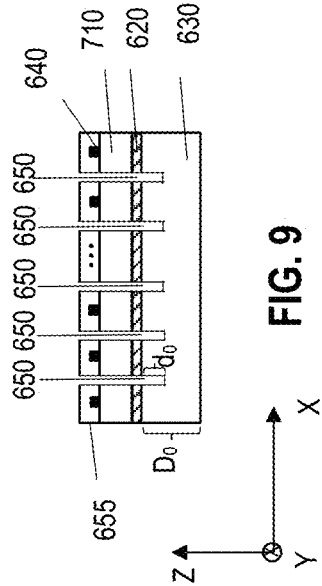

Method 500 proceeds to operation 525, as illustrated in FIG. 8, in which a protective layer is formed. As shown in FIG. 8, a protective layer 645 is formed over the first device wafer 710. The protective layer 645 may include any suitable materials that can prevent the first device wafer 710 from being damaged during operation 530 to form the first ablation structures 650. The protective layer 645 may include a soft material (e.g., photoresist), a hard material (e.g., carbon, silicon oxide, and silicon nitride), or a combination thereof. The protective layer 645 may be a single-layered structure or a multi-layered structure. In some embodiments, the protective layer 645 includes a layer of photoresist and is spun on the first device wafer 710. In some embodiments, the protective layer 645 is a layer of blue membrane or UV membrane having a thickness between 10 μm and 200 μm.

Figure 9:
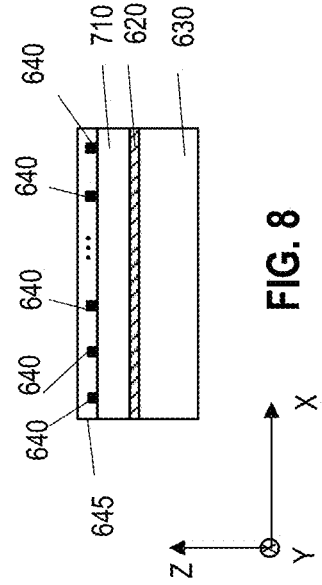

Method 500 proceeds to operation 530, as illustrated in FIG. 9, in which a plurality of ablation structures are formed by for example without limitation, laser grooving or mechanical sawing methods. However, the width of the ablation structures may be about between 65 μm and 80 μm if formed by mechanical sawing and about between 25 μm and 40 μm if formed by laser grooving. Therefore, forming the ablation structures by laser grooving rather than mechanical sawing may increase the usable areas for dies in the device wafers. As shown in FIG. 9, a plurality of first ablation structures 650 are formed by dicing through the protective layer 645, the first device wafer 710, the adhesion layer 620 and a portion of the carrier wafer 630. In some embodiments, the plurality of first ablation structures 650 have a portion in the carrier wafer 630, the portion having a depth denoted by $d_0$, which is no greater than one half of a thickness of the carrier wafer 630, denoted by $D_0$. Thus, $d_0 \leq 0.5 D_0$. The plurality of first ablation structures 650 are formed so that each pair of adjacent first dies of the first device wafer 710 are separated by one of the plurality of first ablation structures 650. After operation 530, the protective layer 645 becomes a plurality of protective layer portion 655 as shown in FIG. 9. In addition, each first die of the first device wafer 710 is covered by a respective protective layer portion 655 as shown in FIG. 9.

Figure 10:
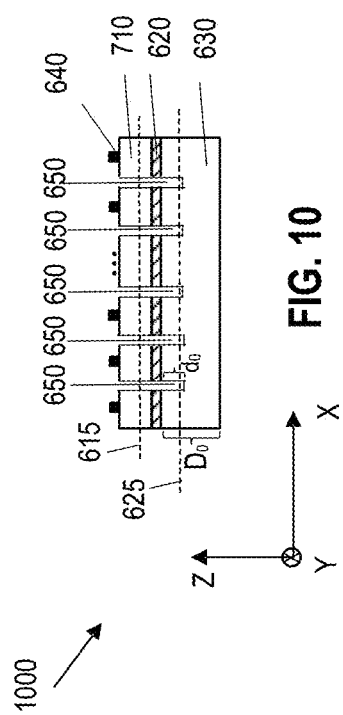

Method 500 proceeds to operation 535, as illustrated in FIG. 10, in which the protective layer, i.e., specifically the respective protective layer portion over the device wafer, is removed. As shown in FIG. 10, the respective protective layer portion 655 on each of the first dies of the first device wafer 710 is removed. The removal of the protective layer portions 655 may include any suitable process, depending on the material(s) of the protective layer portions 655. For example, when the protective layer portions 655 include hard materials (e.g., carbon, silicon oxide, and/or silicon nitride), the removal process may include an etching (e.g., dry etch and/or wet etch) and/or a chemical mechanical planarization process. In some embodiments, when the protective layer portions 655 include photoresist, the removal process may include rinsing in a photoresist remover and/or a plasma treatment (e.g., oxygen plasma combustion). In addition, a surface treatment may be performed on the first dies of the first device wafer 710 to prepare the first dies for bonding. Depending on the type of bonding and the bonds formed between dies, any suitable surface treatment may be performed. In some embodiments, the bonding process includes a hybrid bonding and the surface treatment includes a plasma activation process. In some embodiments, the surface treatment also includes a wet treatment and/or a thermal treatment.

Figure 38:
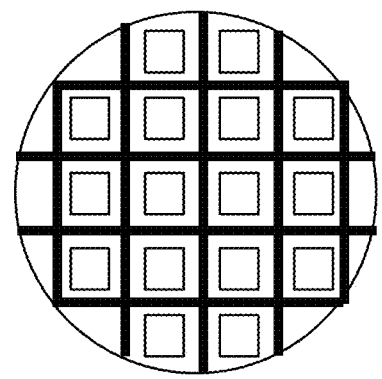
FIG. 38 illustrates a schematic cross-sectional view of a device wafer, according to some embodiments.

FIG. 38 illustrates a schematic cross-sectional view of the first device wafer 710 along a first cutting line 615 as shown in FIG. 10, according to some embodiments. As shown in FIG. 38, the solid black lines collectively represent a cross-section of the plurality of first ablation structures 650 along the first cutting line 615, and the hollow boxes collectively represent a cross-section of the plurality of first dies in the first device wafer 710 along the first cutting line 615. The cross-section of the first device wafer 710 as shown in FIG. 38 includes the cross-section of the plurality of first ablation structures 650 along the first cutting line 615. The cross-section of the first device wafer 710 as shown in FIG. 38 also includes the cross-section of the plurality of first dies of the first device wafer 710 along the first cutting line 615.

Figure 39:
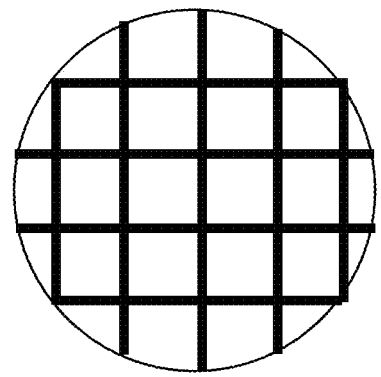
FIG. 39 illustrates a schematic cross-sectional view of a carrier wafer, according to some embodiments.

FIG. 39 illustrates a schematic cross-sectional view of the carrier wafer 630 along a second cutting line 625 as shown in FIG. 10, according to some embodiments. As shown in FIG. 39, the solid black lines collectively represent a cross-section of the plurality of first ablation structures 650 along the second cutting line 625. The cross-section of the carrier wafer 630 as shown in FIG. 39 includes the cross-section of the plurality of first ablation structures 650 along the second cutting line 625.

Method 500 proceeds to operation 540, in which it is determined whether there is any more device wafer to be stacked. For example, at operation 540, it is determined whether there is a second device wafer to be stacked to the first device wafer. When it is determined there is no more device wafer, method 500 proceeds to operation 550. Otherwise, method 500 proceeds to operation 545, as illustrated in FIGS. 11 and 12, in which an additional device wafer is stacked to the current device wafer. For example, at operation 545, a second device wafer is stacked to the first device wafer. In some embodiments, the second device wafer is stacked to the first device wafer by bonding each of the second dies of the second device wafer to a respective first die of the first device wafer. In some embodiments, each first die and the respective second die are in a face-to-face manner so the bonding contacts on the front side of the first die can be aligned and facing the bonding contacts on the front side of the second die. In some embodiments, each first die and the respective second die are in a back-to-back manner so the bonding contacts on the back side of first die can be aligned and facing the bonding contacts on the back side of the second die. In some embodiments, each first die and the respective second die are in a face-to-back manner so the bonding contacts on the front side of first die can be aligned and facing the bonding contacts on the back side of the second die, or the bonding contacts on the back side of first die can be aligned and facing the bonding contacts on the front side of the second die. In some embodiments, the first device wafer is the first device wafer $100_1$, and the second device wafer is the second device wafer $100_2$ as shown in FIG. 1.

In some embodiments, the second device wafer stacked to the first device wafer is the second device wafer 1150 stacked to the first device wafer 710 in FIG. 12. The second device wafer 1150 has an architecture similar to the device wafer 360 in FIG. 3B. The second device wafer 1150 includes a first side of the second device wafer 1150 bonded to the first device wafer 710. In addition, the second device wafer 1150 includes a second side of the second device wafer 1150 including a plurality of bonding contacts 1200. In some embodiments, the first side of the second device wafer 1150 is opposite to the second side of the second device wafer 1150. In some embodiments, the second device wafer 1150 has a thickness, denoted by $D_2$, between 1 μm and 10 μm. In some embodiments, the first side of the second device wafer 1150 is a front side of the second device wafer 1150, and the second side of the second device wafer 1150 is a back side of the second device wafer 1150. In some embodiments, the first side of the second device wafer 1150 is the back side of the second device wafer 1150, and the second side of the second device wafer 1150 is the front side of the second device wafer 1150. After operation 545 is completed, method 500 skips operations 515 and 520 and returns to operation 525, which will be described in further details.

In some embodiments, the second device wafer stacked to the first device wafer is the second device wafer 1100 stacked to the first device wafer 710 in FIG. 11. The second device wafer 1100 has an architecture similar to the device wafer 340 in FIG. 3A. In some embodiments, the second device wafer 1100 includes a front side of the second device wafer 1100 bonded to the first device wafer 710. In addition, the second device wafer 1100 includes no bonding contacts on the back side of the second device wafer 1100 as shown in FIG. 11. In some embodiments, the second device wafer 1100 has a thickness, $D_2$, greater than 10 μm.

Method 500 returns to operation 515, as illustrated in FIG. 12, in which the second device wafer 1100 is thinned Specifically, the back side of the second device wafer 1100 is thinned by any suitable planarization process (e.g., chemical mechanical planarization and/or recess etching) until the thickness of the second device wafer 1100 is between 1 μm and 10 μm. This is done so that the second device wafer 1100 in FIG. 11 is processed to be the second device wafer 1150 in FIG. 7.

Method 500 proceeds to operation 520, as illustrated in FIG. 12, in which a plurality of bonding contacts are formed on the additional device wafer. As shown in FIG. 12, the plurality of bonding contacts 1200 are formed on the second device wafer 1150. Specifically, the plurality of bonding contacts 1200 are formed on the back side of the second device wafer 1150. In some embodiments, a dielectric layer is formed on the back side of the second device wafer 1150 before the plurality of bonding contacts 1200 are formed. This is done so that the plurality of bonding contacts 1200 can be isolated electrically by dielectrics. In some embodiments, the plurality of bonding contacts 1200 may be formed in a similar way as the plurality of bonding contacts 640 in FIG. 7, which will not be repeated here.

Method 500 proceeds to operation 525, as illustrated in FIG. 13, in which a protective layer is formed. As shown in FIG. 13, a protective layer 1300 is formed over the second device wafer 1150. The protective layer 1300 may include any suitable materials that can prevent the second device wafer 1150 from being damaged during the subsequent operation 530 to form the second ablation structures 1450. The protective layer 1300 may be similar to the protective layer 645 in FIG. 8.

Method 500 proceeds to operation 530, as illustrated in FIG. 14, in which a plurality of ablation structures are formed on the additional device wafer according to the first ablation structures. As shown in FIG. 14, a plurality of second ablation structures 1450 are formed by dicing through the protective layer 1300 and a portion of the second device wafer 1150 according to the plurality of first ablation structures 650. The plurality of second ablation structures 1450 may be formed by dicing using either laser grooving or mechanical sawing methods. In some embodiments, the plurality of second ablation structures 1450 may be formed using a similar method as the plurality of first ablation structures 650. The plurality of second ablation structures 1450 have a portion in the second device wafer, the portion having a depth denoted by $d_2$, which is no greater than one half of a thickness of the second device wafer 1150, denoted by $D_2$. Thus, $d_2 \leq 0.5 D_2$. The plurality of second ablation structures 1450 are formed so that each pair of adjacent second dies of the second device wafer 1150 are separated by one of the plurality of second ablation structures 1450. After operation 530, the protective layer 1300 becomes a plurality of protective layer portion 1350 as shown in FIG. 14. In addition, each second die of the second device wafer 1150 is covered by a respective protective layer portion 1350 as shown in FIG. 14.

Method 500 proceeds to operation 535, as illustrated in FIG. 15, in which the protective layer, i.e., specifically the respective protective layer portion over the additional device wafer, is removed. As shown in FIG. 15, the respective protective layer portion 1350 on each of the second dies of the second device wafer 1150 is removed. The process of removing the protective layer portions 1350 and associated surface treatment are similar to the process of removing the protective layer portions 655 and the associated surface treatment as described before, which will not be repeated here.

In some embodiments, a cross-section of the second device wafer 1150 along the cutting line 1550 is the same as, or substantially similar to, the cross-section of the first device wafer 710 along the first cutting line 615 in FIG. 10 as shown in FIG. 38, in which the solid black lines collectively represent the second ablation structures 1450, and the hollow boxes collectively represent the second dies of the second device wafer 1150. In some embodiments, the cross-section of the second device wafer 1150 along the cutting line 1550 includes the cross-section of the plurality of second ablation structures 1450 along the cutting line 1550. In some embodiments, the entirety or at least a majority of the cross-section of the plurality of second ablation structures 1450 (along the cutting line 1550 in FIG. 15) overlaps with the cross-section of the plurality of first ablation structures 650 (along the first cutting line 615 or the second cutting line 625 in FIG. 10) when overlaying the cross-section of the carrier wafer 630 having the cross-section of the plurality of first ablation structures 650 (along the second cutting line 625 in FIG. 10) as shown in FIG. 39 and the cross-section of the second device wafer 1150 having the cross-section of the plurality of second ablation structures 1450 (along the cutting line 1550 in FIG. 15) as shown in FIG. 38.

Method 500 proceeds to operation 540, in which it is determined whether there is any more device wafer to be stacked. For example, at operation 540, it is determined whether there is a third device wafer to be stacked to the second device wafer. If so, method 500 proceeds to operation 545, in which the third device wafer is stacked to the second device wafer. This foregoing method repeats until the last device wafer, for example, the $M_{th}$ device wafer $100_M$ in FIG. 1, has experienced operations 545, 525, 530, 535, and 540 sequentially (with or without operations 515 and 520) and at operation 540, it is determined no more device wafer to be stacked, for example, to the $M_{th}$ device wafer $100_M$. Thus, method 500 proceeds to operation 550, which will be discussed in further details.

As shown in FIG. 16, the last device wafer is the $M_{th}$ device wafer 1600, which includes a plurality of padding contacts 1520. The plurality of padding contacts 1520 in FIG. 16 may be similar to the plurality of bonding contacts 640, 1200, and 1610. However, the plurality of padding contacts 1520 are named so rather than a plurality of bonding contacts because these contacts are for padding-out purpose, not bonding purpose. In some embodiments, the $M_{th}$ device wafer 1600 is the $M_{th}$ device wafer $100_M$ in FIG. 1. In some embodiments, the $M_{th}$ device wafer 1600 is stacked to the $(M-1)_{th}$ device wafer (not shown) through bonding using a plurality of bonding contacts 1610. A plurality of $M_{th}$ ablation structures 1660 are formed in the $M_{th}$ device wafer 1600. Each of the plurality of $M_{th}$ ablation structures 1660 has a depth, denoted by $d_M$, which is no greater than one half of a thickness of the $M_{th}$ device wafer 1600, denoted by $D_M$. Thus, $d_M \leq 0.5 D_M$.

In some embodiments, a cross-section of the $M_{th}$ device wafer 1600 along the cutting line 1650 is the same as, or substantially similar to, the cross-section of the first device wafer 710 along the first cutting line 615 in FIG. 10 as shown in FIG. 38, in which the solid black lines collectively represent the $M_{th}$ ablation structures 1660, and the hollow boxes collectively represent the $M_{th}$ dies of the $M_{th}$ device wafer 1600. In some embodiments, the cross-section of the $M_{th}$ device wafer 1600 along the cutting line 1650 includes the cross-section of the plurality of $M_{th}$ ablation structures 1660 along the cutting line 1650. In some embodiments, the entirety or at least a majority of the cross-section of the plurality of $M_{th}$ ablation structures (along the cutting line 1650 in FIG. 16) overlaps with the cross-section of the plurality of first ablation structures (along the first cutting line 615 or the second cutting line 625 in FIG. 10) when overlaying the cross-section of the carrier wafer 630 having the cross-section of the plurality of first ablation structures 650 (along the second cutting line 625 in FIG. 10) as shown in FIG. 39 and the cross-section of the $M_{th}$ device wafer 1600 having the cross-section of the plurality of $M_{th}$ ablation structures 1660 (along the cutting line 1650 in FIG. 16) as shown in FIG. 38.

Method 500 proceeds to operation 550, as illustrated in FIG. 16, in which conductive wires are connected to the last device wafer for padding out purpose. As shown in FIG. 16, a plurality of conductive wires 1530 are connected to the plurality of padding contacts 1520. In some embodiments, a conductive wire 1530 is connected to each of the plurality of padding contacts 1520. The plurality of conductive wires 1530 and the plurality of padding contacts 1520 may be collectively used to transfer electrical signals between the $M_{th}$ dies of the $M_{th}$ device wafers 1600 and another external circuit.

Method 500 proceeds to operation 555, as illustrated in FIG. 17, in which the adhesivity of the adhesion layer is decreased by illuminating ultraviolet radiations to the adhesion layer through the carrier device. As shown in FIG. 17, ultraviolet radiations 1700 are illuminated with a power between 50 mJ/cm² and 500 mJ/cm² to the adhesion layer 620 through the carrier wafer 630 for a period between 10 seconds and 200 seconds. This is done so that the adhesivity of the adhesion layer 620 can be decreased by between 90% and 99%.

Method 500 proceeds to operation 560, as illustrated in FIG. 18, in which carrier wafer and device wafers are diced through along planes in which a series of ablation structures are located and extend. In some embodiments, as shown in FIG. 18, a protective layer 1800 is applied to the carrier wafer 630. The protective layer 1800 may be similar to the protective layers 645 and 1300. An appropriate dicing method, for example, a laser grooving method or a mechanical sawing method may be applied to dice through the protective layer 1800, the carrier wafer 630, the first device wafer 710, the second device wafer 1150, . . . , and the $M_{th}$ device wafer 1600 along the planes 1850 in which the first ablation structures 650, the second ablation structures 1450, . . . , and the $M_{th}$ ablation structures 1660 are located and extend. In some embodiments, the protective layer 1800 in FIG. 18 is not required to be applied to the carrier wafer 630. Accordingly, an appropriate dicing method, for example, a laser grooving method or a mechanical sawing method may be applied to dice through the carrier wafer 630, the first device wafer 710, the second device wafer 1150, . . . , and the $M_{th}$ device wafer 1600 along the planes 1850 in which the first ablation structures 650, the second ablation structures 1450, . . . , and the $M_{th}$ ablation structures 1660 are located and extend.

Figure 19:
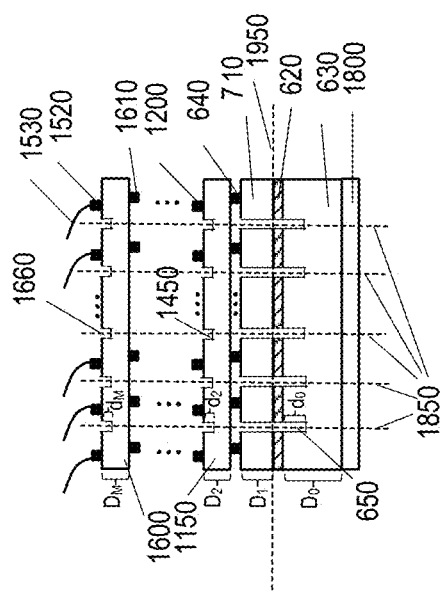

Method 500 proceeds to operation 565, in which the carrier wafer and the adhesion layer are removed. In some embodiments, a lateral force is applied, as illustrated in FIG. 19, on the interface between the adhesion layer and the first device wafer in order to remove the carrier wafer and the adhesion layer. For example, a lateral force is applied on the interface 1950, as shown in FIG. 19, between the first device wafer 710 and the adhesion layer 620. The lateral force can be nominally along a horizontal direction (e.g., a direction perpendicular to the direction series of ablation structures extend). The lateral force can also be a horizontal component of a force that has an angle with the horizontal direction. In some embodiments, the lateral force and the lateral component each is along a horizontal direction pointing away from the plane in which a series of ablation structures are located. In some embodiments, the lateral force and the lateral component each are along the X-Y plane as shown in FIG. 18. In some embodiments, operation 565 and operation 560 are performed at the same time. In some embodiments, operation 565 is performed after operation 560 starts but before operation 560 is finished. In some embodiments, operation 565 is performed after operation 560 is finished.

Figure 20:
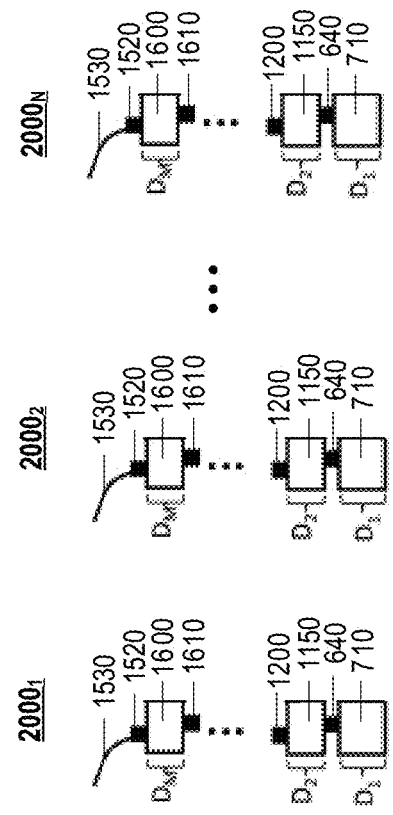

Method 500 proceeds to operation 570, as illustrated in FIG. 20, in which a plurality of separated bonded semiconductor devices are provided. As shown in FIG. 20, a plurality of separated bonded semiconductor devices $2000_1$, $2000_2$, . . . , and $2000_N$ are provided. Each of the plurality of semiconductor devices $2000_1$, $2000_2$, . . . , and $2000_N$ includes a series of bonded dies, which include a first die from the first device wafer 710, a second die from the second device wafer 1150, . . . , and an $M_{th}$ die from the $M_{th}$ device wafer 1600. The $M_{th}$ die in each of the bonded semiconductor devices $2000_1$, $2000_2$, . . . , and $2000_N$ is connected to a conductive wire 1530 through a padding contact 1520 as shown in FIG. 20.

Figure 21:
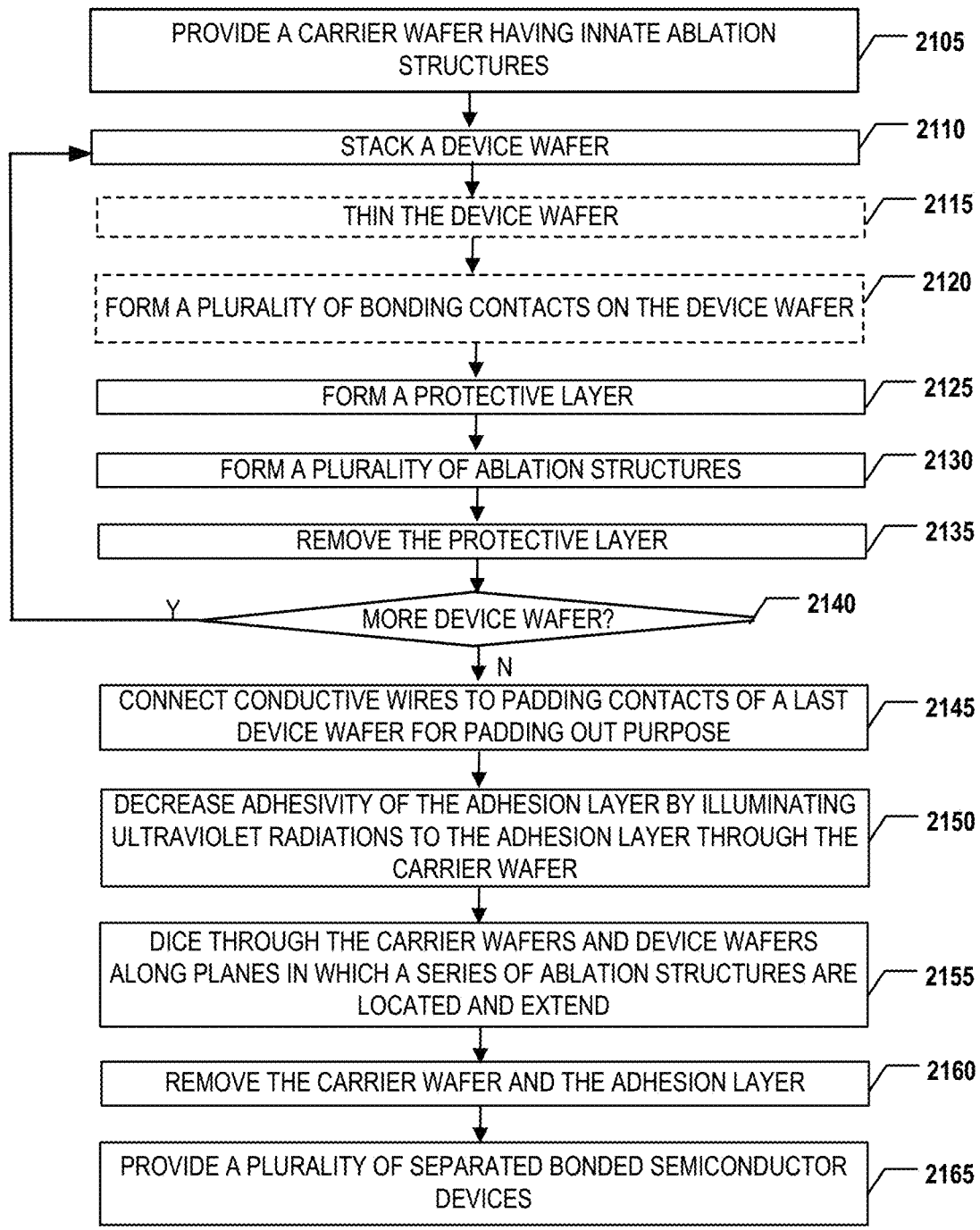
FIG. 21 is a flowchart of an exemplary method for stacking and dicing a plurality of device wafers to produce a plurality of bonded semiconductor devices, according to some embodiments.

FIG. 21 is a flowchart of an exemplary method 2100 for stacking and dicing a plurality of device wafers to produce a plurality of bonded semiconductor devices, according to some embodiments. It is understood that the operations shown in method 2100 are not exhaustive and that other operations can be performed as well before, after, or between any of the illustrated operations. Further, some of the operations may be performed simultaneously, or in a different order than shown in FIG. 21. FIGS. 22-36 illustrate an exemplary process for implementing method 2100 in FIG. 21, according to some embodiments. For ease of illustration, method 2100 is described in view of the process shown in FIGS. 22-36.

Referring to FIG. 21, method 2100 starts at operation 2105, as illustrated in FIG. 22, in which a carrier wafer having a plurality of innate ablation structures is provided. As shown in FIG. 22, the carrier wafer 2210 includes a plurality of innate ablation structures 2250. The plurality of innate ablation structures 2250 may be formed by dicing using either laser grooving or mechanical sawing methods. In some embodiments, the width of each innate ablation structure 2250 may be about between 65 µm and 80 µm if formed by mechanical sawing and about between 25 µm and 40 µm if formed by laser grooving. The plurality of innate ablation structures 2250 have a depth, denoted by $d_0$, which is no greater than one half of a thickness of the carrier wafer 2210, denoted by $D_0$. Thus, $d_0 \leq 0.5 D_0$. In some embodiments, a cross-section of the carrier wafer 2210 along the cutting line 2240 is the same as, or substantially similar to the cross-section shown in FIG. 39, in which the solid black lines collectively represent the innate ablation structures 2250 along the cutting line 2240.

Method 2100 proceeds to operation 2110, as illustrated in FIGS. 22 and 23, in which a device wafer is stacked. In some embodiments, when the device wafer is a first device wafer, the first device wafer is stacked to the carrier wafer with an adhesion layer between the first device wafer and the carrier wafer. In some embodiments, the first device wafer may be the first device wafer $100_1$ in FIG. 1. In some embodiments, the adhesion layer may be formed by any suitable process such as deposition and/or spinning on an adhesive onto the carrier wafer and/or the first device wafer. Alternatively or in addition, the adhesion layer may be first applied to a first side of the first device wafer when the first side of the first device wafer faces up. Then the first device wafer with the adhesion layer on top is flipped upside down and finally stacked to the carrier wafer. In some embodiments, when the device wafer is not the first device wafer, the device wafer may be stacked to a previous device wafer by bonding through a plurality of bonding contacts.

In some embodiments, the device wafer at operation 2110 is the first device wafer 2235 as shown in FIG. 23, in which the first device wafer 2235 is stacked to the carrier wafer 2210 with an adhesion layer 2220 between the carrier wafer 2210 and the first device wafer 2235. In some embodiments, the first device wafer 2235 has an architecture similar to the device wafer 360 in FIG. 3B. In some embodiments, the first device wafer 2235 is the device wafer 360 in FIG. 3B. The first device wafer 2235 includes a first side of the first device wafer 2235 in contact with the adhesion layer 2220. In addition, the first device wafer 2235 includes a second side of the first device wafer 2235 including a plurality of bonding contacts 2340. In some embodiments, the first side of the first device wafer 2235 is opposite to the second side of the first device wafer 2235. In some embodiments, the first device wafer 2235 has a thickness, denoted by $D_1$, between 1 µm and 10 µm. In some embodiments, the first side of the first device wafer 2235 is a front side of the first device wafer 2235, and the second side of the first device wafer 2235 is a back side of the first device wafer 2235. In some embodiments, the first side of the first device wafer 2235 is the back side of the first device wafer 2235, and the second side of the first device wafer 2235 is the front side of the first device wafer 2235. After operation 2110 is completed, method 2100 skips operations 2115 and 2120 and proceeds to operation 2125, which will be described in further details.

In some embodiments, the device wafer at operation 2110 is the first device wafer 2230 as shown in FIG. 22, in which the first device wafer 2230 is stacked to the carrier wafer 2210 with an adhesion layer 2220 between the carrier wafer 2210 and the first device wafer 2230. In some embodiments, the first device wafer 2230 has a similar architecture to the device wafer 340 in FIG. 3A. In some embodiments, the first device wafer 2230 is the device wafer 340 in FIG. 3A. In some embodiments, the first device wafer 2230 includes a front side of the first device wafer 2230 in contact with the adhesion layer 2220. In addition, the first device wafer 2230 includes no bonding contacts on the back side of the first device wafer 2230 as shown in FIG. 22. In some embodiments, the first device wafer 2230 has a thickness, denoted by $D_1$, greater than 10 μm.

Method 2100 proceeds to operation 2115, as illustrated in FIG. 23, in which the first device wafer is thinned. As shown in FIG. 23, the first device wafer 2230 is thinned to become the first device wafer 2235. Specifically, the back side of the first device wafer 2230 is thinned by any suitable planarization process (e.g., chemical mechanical planarization and/or recess etching) until the thickness of the first device wafer 2230, $D_1$, is between 1 μm and 10 μm. This is done so that the first device wafer 2230 in FIG. 22 is processed to be the first device wafer 2235 in FIG. 23.

Method 2100 proceeds to operation 2120, as illustrated in FIG. 23, in which a plurality of bonding contacts are formed on the first device wafer. As shown in FIG. 23, the plurality of bonding contacts 2340 are formed on the first device wafer 2235. Specifically, the plurality of bonding contacts 2340 are formed on the back side of the first device wafer 2235. In some embodiments, a dielectric layer is formed on the back side of the first device wafer 2235 before the plurality of bonding contacts 2340 is formed. This is done so that the plurality of bonding contacts 2340 can be isolated electrically by dielectrics. In some embodiments, the plurality of bonding contacts 2340 is formed through the dielectric layer and in contact with the interconnect layer by first patterning contact holes through the dielectric layer using a patterning process (e.g., photolithography and dry/wet etch of dielectric materials in the dielectric layer). The contact holes can be filled with a conductor (e.g., copper). In some embodiments, each of the plurality of bonding contacts 2340 is a TSV or a TSC.

Method 2100 proceeds to operation 2125, as illustrated in FIG. 24, in which a protective layer is formed. As shown in FIG. 24, a protective layer 2400 is formed over the first device wafer 2235. The protective layer 2400 may include any suitable materials that can prevent the first device wafer 2235 from being damaged during operation 2130 to form first ablation structures 2550. The protective layer 2400 may include a soft material (e.g., photoresist), a hard material (e.g., carbon, silicon oxide, and silicon nitride), or a combination thereof. The protective layer 2400 may be a single-layered structure or a multi-layered structure. In some embodiments, the protective layer 2400 includes a layer of photoresist and is spun on the first device wafer 2235. In some embodiments, the protective layer 2400 is a layer of blue membrane or UV membrane having a thickness between 10 μm and 200 μm.

Method 2100 proceeds to operation 2130, as illustrated in FIG. 25, in which a plurality of ablation structures is formed. For example, a plurality of first ablation structures are formed by dicing through the protective layer and a portion of the first device wafer, according to the plurality of innate ablation structures in the carrier wafer. As shown in FIG. 25, a plurality of first ablation structures 2550 are formed by dicing through the protective layer 2400 and a portion of the first device wafer 2235 according to the plurality of innate ablation structures 2250 in the carrier wafer 2210. The plurality of first ablation structures 2550 may be formed by dicing using either laser grooving or mechanical sawing methods. In some embodiments, the width of each first ablation structure may be between 65 μm and 80 μm by mechanical sawing and between 25 μm and 40 μm by laser grooving. Therefore, forming the first ablation structures 2550 using a laser grooving method rather than mechanical sawing methods may increase the usable areas for dies in the device wafers. The plurality of first ablation structures 2550 have a portion in the first device wafer 2235, the portion having a depth, denoted by $d_1$, which is no greater than one half of a thickness of the first device wafer 2235, denoted by $D_1$. Thus, $d_1 \leq 0.5 D_1$. The plurality of first ablation structures 2550 are formed so that each pair of adjacent first dies of the first device wafer 2235 are separated by one of the plurality of first ablation structures 2550. After operation 2130, the protective layer 2400 becomes a plurality of protective layer portion 2450 as shown in FIG. 25. In addition, each first die of the first device wafer 2235 is covered by a respective protective layer portion 2450 as shown in FIG. 25.

Figure 26:
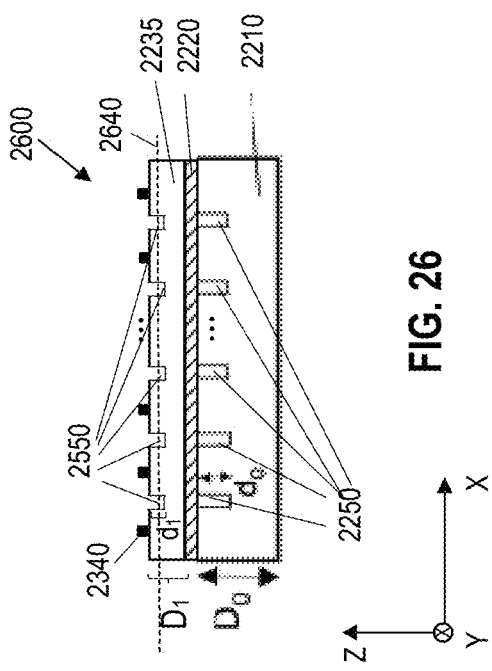

Method 2100 proceeds to operation 2135, as illustrated in FIG. 26, in which the protective layer, i.e., specifically the respective protective layer portion over the device wafer, is removed. As shown in FIG. 26, the respective protective layer portion 2450 on each of the first dies of the first device wafer 2235 is removed. The removal of the protective layer portions 2450 may include any suitable process, depending on the material(s) of the protective layer portions 2450. For example, when the protective layer portions 2450 include hard materials (e.g., carbon, silicon oxide, and/or silicon nitride), the removal process may include an etching (e.g., dry etch and/or wet etch) and/or a chemical mechanical planarization process. In some embodiments, when the protective layer portions 2450 include photoresist, the removal process may include rinsing in a photoresist remover and/or a plasma treatment (e.g., oxygen plasma combustion). In addition, a surface treatment may be performed on the first dies of the first device wafer 2235 to prepare the first dies of the first device wafer 2235 for bonding. Depending on the type of bonding and the bonds formed between dies, any suitable surface treatment may be performed. In some embodiments, the bonding process includes a hybrid bonding and the surface treatment includes a plasma activation process. In some embodiments, the surface treatment also includes a wet treatment and/or a thermal treatment.

In some embodiments, a cross-section of the first device wafer 2235 along the cutting line 2640 is the same as, or substantially similar to the cross-section of the first device wafer 710 along the first cutting line 615 in FIG. 10 as shown in FIG. 38, in which the solid black lines collectively represent the first ablation structures 2550, and the hollow boxes collectively represent the first dies of the first device wafer 2235. In some embodiments, the cross-section of the first device wafer 2235 along the cutting line 2640 includes the cross-section of the plurality of first ablation structures 2550 along the cutting line 2640. In some embodiments, the entirety or at least a majority of the cross-section of the plurality of first ablation structures 2550 (along the cutting line 2640 in FIG. 26) overlaps with the cross-section of the plurality of innate ablation structures 2250 (along the first cutting line 2240 in FIG. 22) when overlaying the cross-section of the carrier wafer 2210 having the cross-section of the plurality of innate ablation structures 2250 (along the cutting line 2240 in FIG. 22) as shown in FIG. 39 and the cross-section of the first device wafer 2235 having the cross-section of the plurality of first ablation structures 2550 (along the cutting line 2640 in FIG. 26) as shown in FIG. 38.

Figure 27:
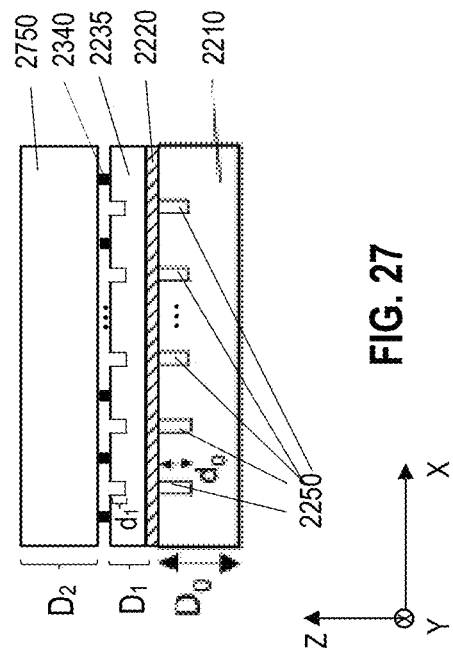
Figure 28:
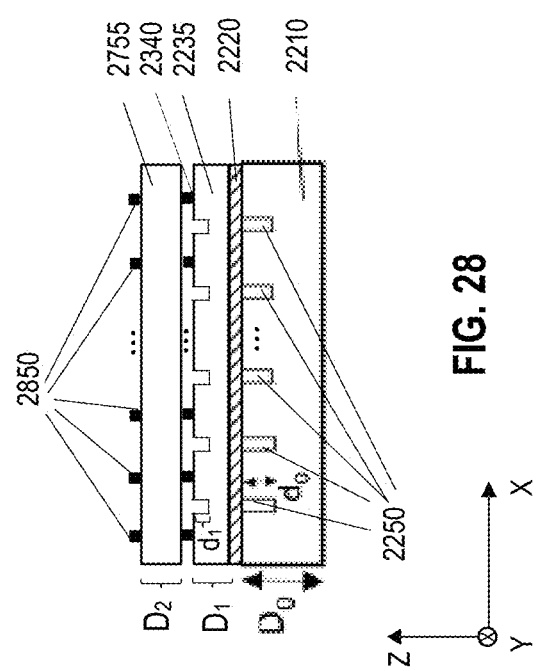

Method 2100 proceeds to operation 2140, in which it is determined whether there is any more device wafer. For example, at operation 2140, it is determined whether there is a second device wafer to be stacked to the first device wafer. When it is determined there is no more device wafer, method 2100 proceeds to operation 2145, which will be described in further details. Otherwise, method 2100 returns to operation 2110, as illustrated in FIGS. 27 and 28, in which an additional device wafer is stacked. For example, at operation 2110, the second device wafer is stacked to the first device wafer. In some embodiments, the second device wafer is stacked to the first device wafer by bonding each of the second dies of the second device wafer to a respective first die of the first device wafer. In some embodiments, each first die and the respective second die are in a face-to-face manner so the bonding contacts on the front side of the first die can be aligned and facing the bonding contacts on the front side of the second die. In some embodiments, each first die and the respective second die are in a back-to-back manner so the bonding contacts on the back side of first die can be aligned and facing the bonding contacts on the back side of the second die. In some embodiments, each first die and the respective second die are in a face-to-back manner so the bonding contacts on the front side of first die can be aligned and facing the bonding contacts on the back side of the second die, or the bonding contacts on the back side of first die can be aligned and facing the bonding contacts on the front side of the second die. In some embodiments, the first device wafer is the first device wafer $100_1$, and the second device wafer is the second device wafer $100_2$ as shown in FIG. 1.

In some embodiments, the second device wafer stacked to the first device wafer is the second device wafer 2755 stacked to the first device wafer 2235 in FIG. 28. The second device wafer 2755 has an architecture similar to the device wafer 360 in FIG. 3B. The second device wafer 2755 includes a first side of the second device wafer 2755 bonded to the first device wafer 2235. In addition, the second device wafer 2755 includes a second side of the second device wafer 2755 having a plurality of bonding contacts 2850. In some embodiments, the first side of the second device wafer 2755 is opposite to the second side of the second device wafer 2755. In some embodiments, the second device wafer 2755 has a thickness, denoted by $D_2$, between 1 μm and 10 μm. In some embodiments, the first side of the second device wafer 2755 is a front side of the second device wafer 2755, and the second side of the second device wafer 2755 is a back side of the second device wafer 2755. In some embodiments, the first side of the second device wafer 2755 is the back side of the second device wafer 2755, and the second side of the second device wafer 2755 is the front side of the second device wafer 2755. After operation 2110 is completed, method 2100 skips operations 2115 and 2120 and proceeds to operation 2125, which will be described in further details.

In some embodiments, the second device wafer stacked to the first device wafer is the second device wafer 2750 stacked to the first device wafer 2235 in FIG. 27. The second device wafer 2750 has an architecture similar to the device wafer 340 in FIG. 3A. In some embodiments, the second device wafer 2750 includes a front side of the second device wafer 2750 bonded to the first device wafer 2235. In addition, the second device wafer 2750 includes no bonding contacts on the back side of the second device wafer 2750 as shown in FIG. 27. In some embodiments, the second device wafer 2750 has a thickness, denoted by $D_2$, which is greater than 10 μm.

Method 2100 proceeds to operation 2115, as illustrated in FIG. 28, in which the additional device wafer is thinned. As shown in FIG. 28, the second device wafer 2750 is thinned. Specifically, the back side of the second device wafer 2750 is thinned by any suitable planarization process (e.g., chemical mechanical planarization and/or recess etching) until the thickness of the second device wafer 2750, $D_2$, is between 1 μm and 10 μm. This is done so that the second device wafer 2750 in FIG. 27 is processed to be the second device wafer 2755 in FIG. 28.

Method 2100 proceeds to operation 2120, as illustrated in FIG. 28, in which a plurality of bonding contacts are formed on the additional device wafer. As shown in FIG. 28, the plurality of bonding contacts 2850 are formed on the second device wafer 2755. Specifically, the plurality of bonding contacts 2850 are formed on the back side of the second device wafer 2755. In some embodiments, a dielectric layer is formed on the back side of the second device wafer 2755 before the plurality of bonding contacts 2850 are formed. This is done so that the plurality of bonding contacts 2850 can be isolated electrically by dielectrics. In some embodiments, the plurality of bonding contacts 2850 may be formed in a similar way as the plurality of bonding contacts 2340 in FIG. 23, which will not be repeated here.

Figure 29:
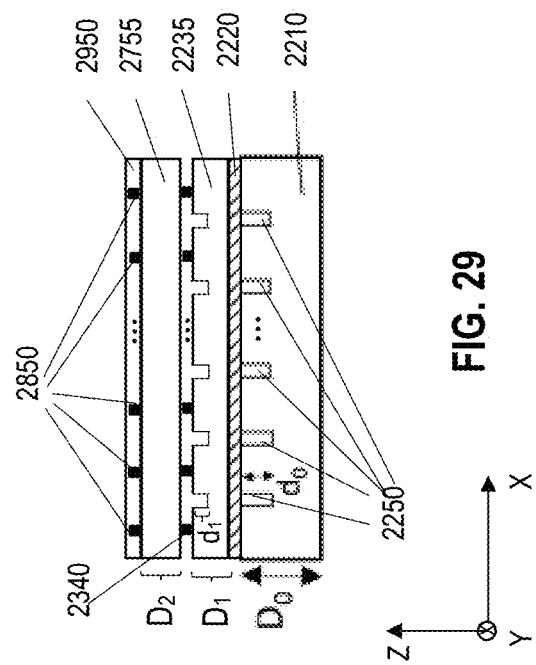

Method 2100 proceeds to operation 2125, as illustrated in FIG. 29, in which a protective layer is formed. As shown in FIG. 29, a protective layer 2950 is formed over the second device wafer 2755. The protective layer 2950 may include any suitable materials that can prevent the second device wafer 2755 from being damaged during the subsequent operation 2130 to form the second ablation structures 3050. The protective layer 2950 may be similar to the protective layer 2400 in FIG. 24.

Method 2100 proceeds to operation 2130, as illustrated in FIG. 30, in which a plurality of ablation structures are formed by dicing through the protective layer and a portion of the additional device wafer according to the plurality of innate ablation structures. As shown in FIG. 30, a plurality of second ablation structures 3050 are formed by dicing through the protective layer 2950 and a portion of the second device wafer 2755 according to the plurality of innate ablation structures 2250. The plurality of second ablation structures 3050 may be formed by dicing using either laser grooving or mechanical sawing methods. In some embodiments, the plurality of second ablation structures 3050 may be formed using a similar method as the plurality of first ablation structures 2550. The plurality of second ablation structures 3050 have a portion in the second device wafer 2755, the portion having a depth, denoted by $d_2$, which is no greater than one half of a thickness of the second device wafer 2755, denoted by $D_2$. Thus, $d_2 \leq 0.5 D_2$. The plurality of second ablation structures 3050 are formed so that each pair of adjacent second dies of the second device wafer 2755 are separated by one of the plurality of second ablation structures 3050. After operation 2130, the protective layer 2950 becomes a plurality of protective layer portion 2955 as shown in FIG. 30. In addition, each second die of the second device wafer 2755 is covered by a respective protective layer portion 2955 as shown in FIG. 30.

Method 2100 proceeds to operation 2135, as illustrated in FIG. 31, in which the protective layer, i.e., specifically the respective protective layer portion over the additional device wafer, is removed. As shown in FIG. 31, the respective protective layer portion 2955 on each of the second dies of the second device wafer 2755 is removed. The process of removing the protective layer portions 2955 and associated surface treatment are similar to the process of removing the protective layer portions 2450 and the associated surface treatment as described before, which will not be repeated here.

In some embodiments, a cross-section of the second device wafer 2755 along the cutting line 3140 is the same as, or substantially similar to the cross-section of the first device wafer 710 along the first cutting line 615 in FIG. 10 as shown in FIG. 38, in which the solid black lines collectively represent the plurality of second ablation structures 3050, and the hollow boxes collectively represent the plurality of second dies of the second device wafer 2755. In some embodiments, the cross-section of the second device wafer 2755 along the cutting line 3140 includes the cross-section of the plurality of second ablation structures 3050 along the cutting line 3140. In some embodiments, the entirety or at least a majority of the cross-section of the plurality of second ablation structures 3050 (along the cutting line 3140 in FIG. 31) overlaps with the cross-section of the plurality of innate ablation structures 2250 (along the cutting line 2240 in FIG. 22) when overlaying the cross-section of the carrier wafer 2210 having the cross-section of the plurality of innate ablation structures 2250 (along the cutting line 2240 in FIG. 22) as shown in FIG. 39 and the cross-section of the second device wafer 2755 having the cross-section of the plurality of second ablation structures 3050 (along the cutting line 3140 in FIG. 31) as shown in FIG. 38.

Method 2100 proceeds to operation 2140, in which it is determined whether there is any more device wafer to be stacked. For example, at operation 2140, it is determined whether there is a third device wafer to be stacked to the second device wafer. If so, method 2100 proceeds to operation 2110, in which the third device wafer is stacked to the second device wafer. This foregoing method repeats until the last device wafer, for example, the $M_{th}$ device wafer $100_M$ in FIG. 1, has experienced operations 2110, 2125, 2130, 2135, and 2140 sequentially (with or without operations 2115 and 2120) and at operation 2140, it is determined no more device wafer to be stacked, for example, to the $M_{th}$ device wafer $100_M$. Thus, method 2100 proceeds to operation 2145, which will be discussed in further details.

As shown in FIG. 32, the last device wafer is the $M_{th}$ device wafer 3200, which includes a plurality of padding contacts 3220. The plurality of padding contacts 3220 in FIG. 32 may be similar to the plurality of bonding contacts 2340, 2850, and 3210. However, the plurality of padding contacts 3220 are named so rather than a plurality of bonding contacts because these contacts are for padding-out purpose, not bonding purpose.

In some embodiments, the $M_{th}$ device wafer 3200 is the $M_{th}$ device wafer $100_M$ in FIG. 1. In some embodiments, the $M_{th}$ device wafer 3200 is stacked to the $(M-1)_{th}$ device wafer (not shown) through bonding using a plurality of bonding contacts 3210. A plurality of $M_{th}$ ablation structures 3250 are formed in the $M_{th}$ device wafer 3200. Each of the plurality of $M_{th}$ ablation structures 3250 has a depth, denoted by $d_M$, which is no greater than one half of a thickness of the $M_{th}$ device wafer 3200, denoted by $D_M$. Thus, $d_M \leq 0.5 D_M$.

In some embodiments, a cross-section of the $M_{th}$ device wafer 3200 along the cutting line 3240 is the same as, or substantially similar to the cross-section of the first device wafer 710 along the first cutting line 615 in FIG. 10 as shown in FIG. 38, in which the solid black lines collectively represent the $M_{th}$ ablation structures 3250, and the hollow boxes collectively represent the second dies of the $M_{th}$ device wafer 3200. In some embodiments, the cross-section of the $M_{th}$ device wafer 3200 along the cutting line 3240 includes the cross-section of the plurality of $M_{th}$ ablation structures 3250 along the cutting line 3240. In some embodiments, the entirety or at least a majority of the cross-section of the plurality of $M_{th}$ ablation structures 3250 (along the cutting line 3240 in FIG. 32) overlaps with the cross-section of the plurality of innate ablation structures (along the cutting line 2240 in FIG. 22) when overlaying the cross-section of the carrier wafer 2210 having the cross-section of the plurality of innate ablation structures 2250 (along the cutting line 2240 in FIG. 22) as shown in FIG. 39 and the cross-section of the $M_{th}$ device wafer 3200 having the cross-section of the plurality of $M_{th}$ ablation structures 3250 (along the cutting line 3240 in FIG. 32) as shown in FIG. 38.

Method 2100 proceeds to operation 2145, as illustrated in FIG. 32, in which conductive wires are connected to a plurality of padding contacts of the last device wafer for padding-out purpose. As shown in FIG. 32, a plurality of conductive wires 3230 are connected to the plurality of padding contacts 3220. In some embodiments, a conductive wire 3230 is connected to each of the plurality of padding contacts 3220. The plurality of conductive wires 3230 and the plurality of padding contacts 3220 may be collectively used to transfer electrical signals between the $M_{th}$ dies of the $M_{th}$ device wafers 3200 and another external circuit.

Method 2100 proceeds to operation 2150, as illustrated in FIG. 33, in which the adhesivity of the adhesion layer is decreased by illuminating ultraviolet radiations to the adhesion layer through the carrier device. As shown in FIG. 33, ultraviolet radiations 3300 are illuminated with a power between 50 mJ/cm$^2$ and 500 mJ/cm$^2$ to the adhesion layer 620 through the carrier wafer 2210 for a period between 10 seconds and 200 seconds. This is done so that the adhesivity of the adhesion layer 2220 can be decreased by between 90% and 99%.

Figure 34:
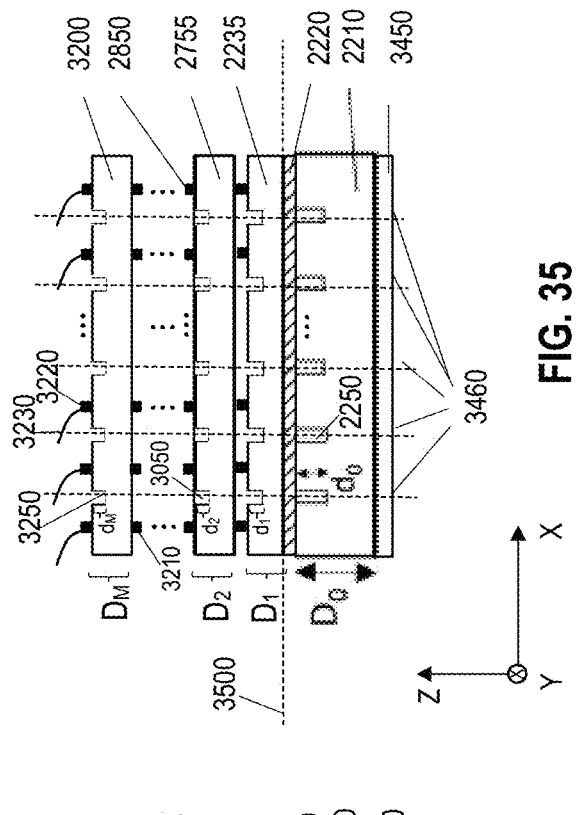

Method 2100 proceeds to operation 2155, as illustrated in FIG. 34, in which carrier wafer and device wafers are diced through along planes in which a series of ablation structures are located and extend. In some embodiments, as shown in FIG. 34, a protective layer 3450 is applied to the carrier wafer 2210. The protective layer 3450 may be similar to the protective layers 2400 and 2950. An appropriate dicing method, for example, a laser grooving or a mechanical sawing method may be applied to dice through the protective layer 3450, the carrier wafer 2210, the adhesion layer 2220, the first device wafer 2235, the second device wafer 2755, . . . , and the $M_{th}$ device wafer 3200 along the planes 3460 in which the innate ablation structures 2250, the first ablation structures 2550, the second ablation structures 3050, . . . , and the $M_{th}$ ablation structures 3250 are located and extend. In some embodiments, the protective layer 3450 in FIG. 34 is not required to be applied to the carrier wafer 2210. Accordingly, an appropriate dicing method, for example, a laser grooving or a mechanical sawing method may be applied to dice through the carrier wafer 2210, the adhesion layer 2220, the first device wafer 2235, the second device wafer 2755, . . . , and the $M_{th}$ device wafer 3200 along the planes 3460 in which the innate ablation structures 2250, the first ablation structures 2550, the second ablation structures 3050, . . . , and the $M_{th}$ ablation structures 3250 are located and extend.

Figure 35:
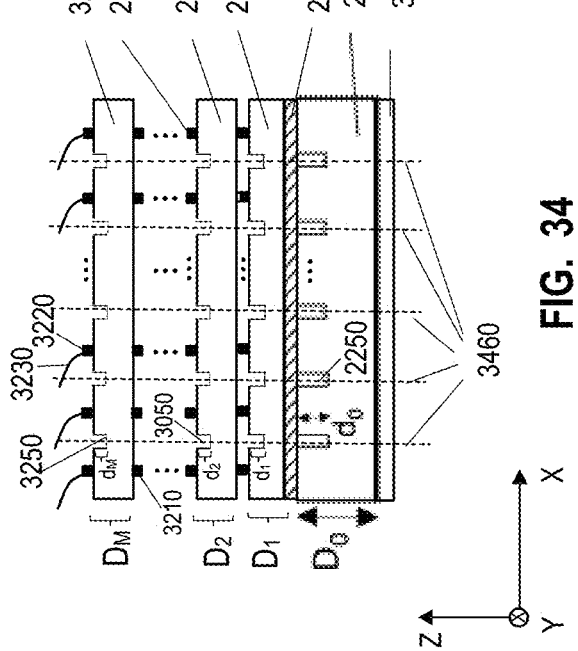

Method 2100 proceeds to operation 2160, in which the carrier wafer and the adhesion layer are removed. In some embodiments, a lateral force is applied onto the interface between the adhesion layer and the first device wafer in order to remove the carrier wafer and the adhesion layer. For example, a lateral force is applied onto the interface 3500, as shown in FIG. 35, between the first device wafer 2235 and the adhesion layer 2220. The lateral force can be nominally along a horizontal direction (e.g., a direction perpendicular to the direction series of ablation structures extend). The lateral force can also be a horizontal component of a force that has an angle with the horizontal direction. In some embodiments, the lateral force and the lateral component each is along a horizontal direction pointing away from the plane in which a series of ablation structures are located. In some embodiments, the lateral force and the lateral component each are along the X-Y plane as shown in FIG. 35. In some embodiments, operation 2155 and operation 2160 are performed at the same time. In some embodiments, operation 2160 is performed after operation 2155 starts but before operation 2155 is finished. In some embodiments, operation 2160 is performed after operation 2155 is finished.

Figure 36:
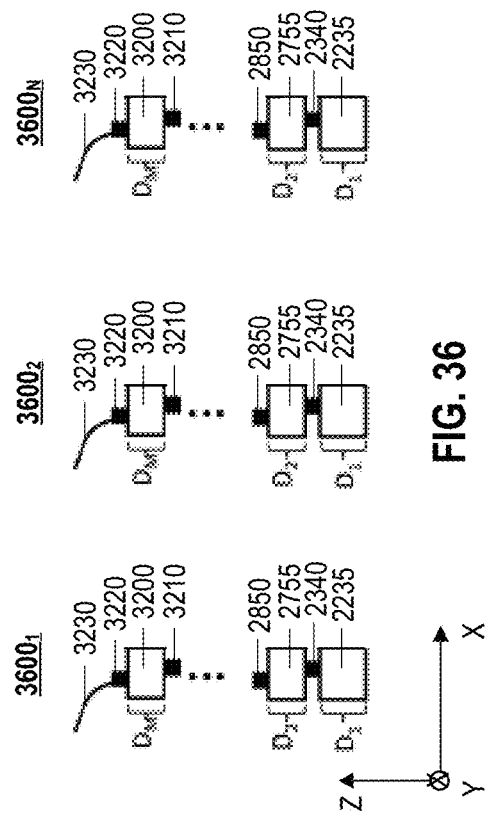

Method 2100 proceeds to operation 2165, as illustrated in FIG. 36, in which a plurality of separated bonded semiconductor devices are provided. As shown in FIG. 36, a plurality of separated bonded semiconductor devices $3600_1$, $3600_2$, ..., and $3600_N$ are provided. In some embodiments, the plurality of bonded semiconductor devices $3600_1$, $3600_2$, ..., and $3600_N$ are similar to the plurality of bonded semiconductor devices $2000_1$, $2000_2$, ..., and $2000_N$ in FIG. 20. Each of the plurality of semiconductor devices $3600_1$, $3600_2$, ..., and $3600_N$ includes a series of bonded dies, which include a first die from the first device wafer 2235, a second die from the second device wafer 2755, ..., and an $M_{th}$ die from the $M_{th}$ device wafer 3200. The $M_{th}$ die in each of the bonded semiconductor devices $3600_1$, $3600_2$, ..., and $3600_N$ is connected to a conductive wire 3230 through a padding contact 3220.

Figure 37:
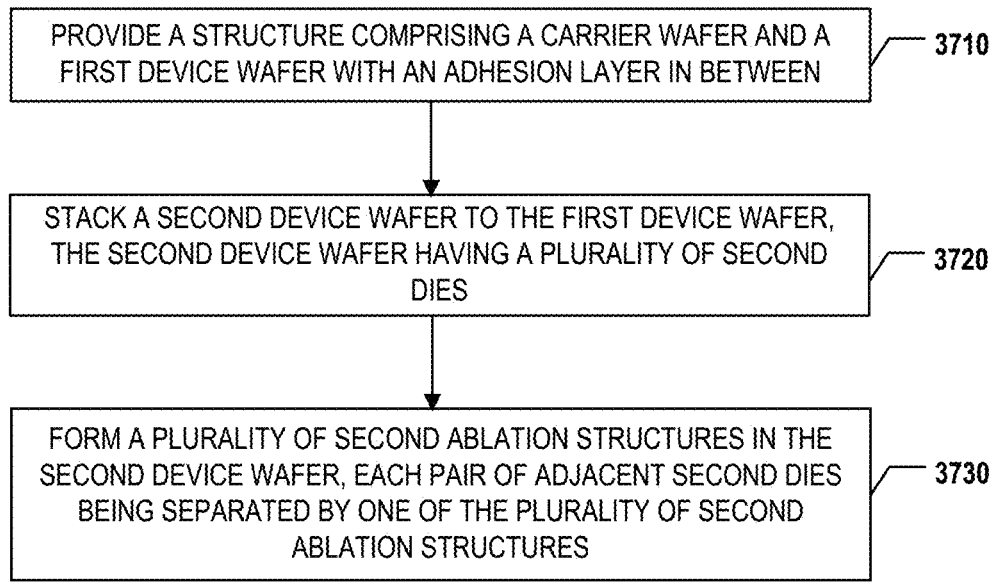
FIG. 37 is a flowchart of an exemplary method for stacking and dicing a plurality of device wafers to produce a plurality of bonded semiconductor devices, according to some embodiments.

FIG. 37 is a flowchart of an exemplary method 3700 for stacking and dicing a plurality of device wafers to produce a plurality of bonded semiconductor devices, according to some embodiments. It is understood that the operations shown in method 3700 are not exhaustive and that other operations can be performed as well before, after, or between any of the illustrated operations. Further, some of the operations may be performed simultaneously, or in a different order than shown in FIG. 37.

Referring to FIG. 37, method 3700 starts at operation 3710, in which a structure including a carrier wafer and a first device wafer with an adhesion layer between the carrier wafer and the first device wafer is provided. In some embodiments, the provided structure at operation 3710 is the structure 1000 in FIG. 10, which includes the carrier wafer 630 and the first device wafer 710 with the adhesion layer 620 between the carrier wafer 630 and the first device wafer 710. In some embodiments, the provided structure at operation 3710 is the structure 2600 in FIG. 26, which includes the carrier wafer 2210 and the first device wafer 2235 with the adhesion layer 2220 between the carrier wafer 2210 and the first device wafer 2235.

Method 3700 proceeds to operation 3720, in which a second device wafer is stacked to the first device wafer, the second device wafer having a plurality of second dies. In some embodiments, the second device wafer at operation 3720 is the second device wafer 1150 in FIG. 12. As shown in FIG. 12, the second device wafer 1150 is stacked to the first device wafer 710 by bonding the second device wafer 1150 to the first device wafer 710 through a plurality of bonding contacts 640. In some embodiments, the second device wafer at operation 3720 is the second device wafer 2755 in FIG. 28. As shown in FIG. 28, the second device wafer 2755 is stacked to the first device wafer 2235 by bonding the second device wafer 2755 to the first device wafer 2235 through a plurality of bonding contacts 2340.

Method 3700 proceeds to operation 3730, in which a plurality of second ablation structures are formed in the second device wafer, each pair of adjacent second dies being separated by one of the plurality of second ablation structures. As shown in FIG. 15, the plurality of second ablation structures 1450 are formed in the second device wafer 1150. In some embodiments, the cross-section of the second device wafer 1150 along the cutting line 1550 in FIG. 15 is the same as, or substantially similar to the cross-section shown in FIG. 38, in which the solid black lines collectively represent the cross-section of the plurality of second ablation structures 1450 along the cutting line 1550, and the hollow boxes collectively represent the cross-section of the second dies of the second device wafer 1150 along the cutting line 1550. Each pair of adjacent second dies of the second device wafer 1150 is separated from each other by one of the plurality of second ablation structures 1450. As shown in FIG. 31, the plurality of second ablation structures 3050 are formed in the second device wafer 2755. In some embodiments, the cross-section of the second device wafer 2755 along the cutting line 3140 in FIG. 31 is the same as, or substantially similar to the cross-section shown in FIG. 38, in which the solid black lines collectively represent the cross-section of the plurality of second ablation structures 3050 along the cutting line 3140, and the hollow boxes collectively represent the cross-section of the second dies of the second device wafer 2755 along the cutting line 3140. Each pair of adjacent second dies of the second device wafer 2755 is separated from each other by one of the plurality of second ablation structures 3050.

Although not shown, method 3700 may further include operations similar to operations 515, 520, 525, 530, 535, 540, and 545 of method 500 in FIG. 5 or operations 2110, 2115, 2120, 2125, 2130, 2135, and 2140 of method 2100 in FIG. 21 to stack and form ablation structures on one or more device wafers. Alternatively or in addition, method 3700 may further include operations 550, 555, 560, 565, and 570 of method 500 in FIG. 5 or operations 2145, 2150, 2155, 2160, and 2165 of method 2100 in FIG. 21 to provide the plurality of separated bonded semiconductor devices by dicing the stacked device wafers. Therefore, these operations are not repeated here.

In some embodiments, a method includes: providing a structure including a carrier wafer, and a first device wafer with an adhesion layer between the carrier wafer and the first device wafer; and forming a plurality of first ablation structures in the structure, each of the plurality of first ablation structures extending through the first device wafer, the adhesion layer and a portion of the carrier wafer.

In some embodiments, each of the plurality of first ablation structures has a portion inside the carrier wafer with a depth no greater than one half of a thickness of the carrier wafer In some embodiments, the first device wafer includes a plurality of first dies, each pair of adjacent first dies being separated by one of the plurality of first ablation structures.

In some embodiments, the plurality of first ablation structures are formed by either laser grooving or mechanical sawing.

In some embodiments, the method further includes: forming a first protective layer on the structure before the plurality of first ablation structures are formed; and removing the first protective layer after the plurality of first ablation structures are formed.

In some embodiments, the first device wafer includes a first side of the first device wafer and a second side of the first device wafer opposite to the first side of the first device wafer, the first side of the first device wafer being in contact with the adhesion layer, and the second side of the first device wafer including a plurality of first bonding contacts configured to be bonded to a second device wafer.

In some embodiments, the method further includes: thinning the first device wafer; and forming the plurality of first bonding contacts on the second side of the first device wafer after the first device wafer is thinned.

In some embodiments, the method further includes: bonding the second device wafer to the first device wafer through the plurality of first bonding contacts.

In some embodiments, the method further includes: forming a plurality of second ablation structures in the second device wafer according to the plurality of first ablation structures, each of the plurality of second ablation structures extending through a portion of the second device wafer, wherein at least a majority of a cross-section of the plurality of second ablation structures overlaps with a cross-section of the plurality of first ablation structures when overlaying a cross-section of the carrier wafer having the cross-section of the plurality of first ablation structures and a cross-section of the second device wafer having the cross-section of the plurality of second ablation structures.

In some embodiments, the second device wafer includes a plurality of second dies, each pair of adjacent second dies being separated by one of the plurality of second ablation structures.

In some embodiments, each of the plurality of second ablation structures has a depth no greater than one half of the thickness of the second device wafer.

In some embodiments, the method further includes: forming a second protective layer on the second device wafer before the plurality of second ablation structures are formed; and removing the second protective layer after the plurality of second ablation structures are formed.

In some embodiments, the method further includes: providing a plurality of separated bonded semiconductor devices by dicing through at least the carrier wafer, the adhesion layer, the first device wafer and the second device wafer along at least the first ablation structures and the second ablation structures, wherein each of the plurality of separated bonded semiconductor devices includes a die from each of the first device wafer and the second device wafer.

In some embodiments, the method further includes decreasing adhesivity of the adhesion layer by between 90% and 99% by illuminating ultraviolet radiations with a power between 50 mJ/cm2 and 500 mJ/cm2 to the adhesion layer through the carrier wafer for a period between 10 seconds and 200 seconds before the plurality of separated bonded semiconductor devices are provided.

In some embodiments, the method further includes: removing the carrier wafer and the adhesion layer from the plurality of separated bonded semiconductor devices before the plurality of separated bonded semiconductor devices are provided.

In some embodiments, the carrier wafer is made of glasses.

In some embodiments, a method includes: providing a structure including a carrier wafer, and a first device wafer with an adhesion layer between the carrier wafer and the first device wafer; stacking a second device wafer to the first device wafer, the second device wafer having a plurality of second dies; and forming a plurality of second ablation structures in the second device wafer, each pair of adjacent second dies being separated by one of the plurality of second ablation structures.

In some embodiments, each of the plurality of second ablation structures extending through a portion of the second device wafer.

In some embodiments, each of the plurality of second ablation structures has a depth no greater than one half of the thickness of the second device wafer.

In some embodiments, the method further includes: forming a second protective layer on the second device wafer before the plurality of second ablation structures are formed; and removing the second protective layer after the plurality of second ablation structures are formed.

In some embodiments, the method further includes: forming a plurality of first ablation structures in the structure, each of the plurality of first ablation structures extending through the first device wafer, the adhesion layer and a portion of the carrier wafer.

In some embodiments, each of the plurality of first ablation structures has a portion inside the carrier wafer with a depth no greater than one half of a thickness of the carrier wafer.

In some embodiments, the first device wafer includes a plurality of first dies, each pair of adjacent first dies being separated by one of the plurality of first ablation structures.

In some embodiments, the plurality of first ablation structures are formed by either laser grooving or mechanical sawing.

In some embodiments, the plurality of second ablation structures are formed in the second device wafer according to the plurality of first ablation structures, wherein at least a majority of a cross-section of the plurality of second ablation structures overlaps with a cross-section of the plurality of first ablation structures when overlaying a cross-section of the carrier wafer having the cross-section of the plurality of first ablation structures and a cross-section of the second device wafer having the cross-section of the plurality of second ablation structures.

In some embodiments, the method further includes: forming a first protective layer on the structure before the plurality of first ablation structures are formed; and removing the first protective layer after the plurality of first ablation structures are formed.

In some embodiments, the first device wafer includes a first side of the first device wafer and a second side of the first device wafer opposite to the first side of the first device wafer, the first side of the first device wafer being in contact with the adhesion layer, and the second side of the first device wafer including a plurality of first bonding contacts configured to be bonded to a second device wafer.

In some embodiments, the method further includes— thinning the first device wafer; and forming the plurality of first bonding contacts on the second side of the first device wafer after the first device wafer is thinned.

In some embodiments, the method further includes: bonding the second device wafer to the first device wafer through the plurality of first bonding contacts.

In some embodiments, the method further including providing a plurality of separated bonded semiconductor devices by dicing through at least the carrier wafer, the adhesion layer, the first device wafer and the second device wafer along at least the first ablation structures and the second ablation structures, wherein each of the plurality of separated bonded semiconductor devices includes a die from each of the first device wafer and the second device wafer.

In some embodiments, the method further includes: decreasing adhesivity of the adhesion layer by between 90% and 99% by illuminating ultraviolet radiations with a power between 50 mJ/cm2 and 500 mJ/cm2 to the adhesion layer through the carrier wafer for a period between 10 seconds and 200 seconds before the plurality of separated bonded semiconductor devices are provided.

In some embodiments, the method further includes: removing the carrier wafer and the adhesion layer from the plurality of separated bonded semiconductor devices before the plurality of separated bonded semiconductor devices are provided.

In some embodiments, the carrier wafer is made of glasses.

In some embodiments, a method includes: providing a carrier wafer having a plurality of innate ablation structures, each of the plurality of innate ablation structures extending through a portion of the carrier wafer; and stacking a first device wafer on the carrier wafer with an adhesion layer between the carrier wafer and the first device wafer, the first device wafer including a plurality of first dies.

In some embodiments, each of the plurality of innate ablation structures has a depth no greater than one half of a thickness of the carrier wafer.

In some embodiments, the first device wafer includes a first side of the first device wafer and a second side of the first device wafer opposite to the first side of the first device wafer, the first side of the first device wafer being in contact with the adhesion layer, and the second side of the first device wafer including a plurality of first bonding contacts configured to be bonded to a second device wafer.

In some embodiments, the method further includes: forming a plurality of first ablation structures in the first device wafer according to the plurality of innate ablation structures, each of the plurality of first ablation structures extending through a portion of the first device wafer, wherein at least a majority of a cross-section of the plurality of first ablation structures overlaps with a cross-section of the plurality of innate ablation structures when overlaying a cross-section of the carrier wafer having the cross-section of the plurality of innate ablation structures and a cross-section of the first device wafer having the cross-section of the plurality of first ablation structures.

In some embodiments, each of the plurality of first ablation structures has a depth no greater than one half of a thickness of the first device wafer In some embodiments, each pair of adjacent first dies being separated by one of the plurality of first ablation structures.

In some embodiments, the method further includes: forming a first protective layer on the structure before the plurality of first ablation structures are formed; and removing the first protective layer after the plurality of first ablation structures are formed.

In some embodiments, the method further includes—thinning the first device wafer; and forming the plurality of first bonding contacts on the second side of the first device wafer after the first device wafer is thinned.

In some embodiments, the method further includes: bonding the second device wafer to the first device wafer through the plurality of first bonding contacts.

In some embodiments, the method further includes: forming a plurality of second ablation structures in the second device wafer according to the plurality of innate ablation structures, each of the plurality of second ablation structures extending through a portion of the second device wafer, wherein at least a majority of a cross-section of the plurality of second ablation structures overlaps with a cross-section of the plurality of innate ablation structures when overlaying a cross-section of the carrier wafer having the cross-section of the plurality of innate ablation structures and a cross-section of the second device wafer having the cross-section of the plurality of second ablation structures.

In some embodiments, the second device wafer includes a plurality of second dies, each pair of adjacent second dies being separated by one of the plurality of second ablation structures.

In some embodiments, each of the plurality of second ablation structures has a depth no greater than one half of the thickness of the second device wafer.

In some embodiments, the method further includes: forming a second protective layer on the second device wafer before the plurality of second ablation structures are formed; and removing the second protective layer after the plurality of second ablation structures are formed.

In some embodiments, the method further includes: providing a plurality of separated bonded semiconductor devices by dicing through at least the carrier wafer, the adhesion layer, the first device wafer and the second device wafer along at least the plurality of innate ablation structures, the plurality of first ablation structures and the plurality of second ablation structures, wherein each of the plurality of separated bonded semiconductor devices includes a die from each of the first device wafer and the second device wafer.

In some embodiments, the method further includes: decreasing adhesivity of the adhesion layer by between 90% and 99% by illuminating ultraviolet radiations with a power between 50 mJ/cm2 and 500 mJ/cm2 to the adhesion layer through the carrier wafer for a period between 10 seconds and 200 seconds before the plurality of separated bonded semiconductor devices are provided.

In some embodiments, the method further includes: removing the carrier wafer and the adhesion layer from the plurality of separated bonded semiconductor devices before the plurality of separated bonded semiconductor devices are provided.

In some embodiments, the carrier wafer is made of glasses.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method comprising:
   providing a structure comprising:
   a carrier wafer, and
   a first device wafer with an adhesion layer between the carrier wafer and the first device wafer;
   forming a plurality of first ablation structures in the structure, each of the plurality of first ablation structures extending through the first device wafer, the adhesion layer and a portion of the carrier wafer;
   bonding a second device wafer on the first device wafer having the plurality of first ablation structures; and
   forming a plurality of second ablation structures in the second device wafer after bonding the second device wafer on the first device wafer.

2. The method of claim 1, wherein each of the plurality of first ablation structures has a portion inside the carrier wafer with a depth no greater than one half of a thickness of the carrier wafer.

3. The method of claim 1, wherein the first device wafer comprises a plurality of first dies, each pair of adjacent first dies being separated by one of the plurality of first ablation structures.

4. The method of claim 1, further comprising:
   forming a first protective layer on the structure before the plurality of first ablation structures are formed; and
   removing the first protective layer after the plurality of first ablation structures are formed.

5. The method of claim 4, wherein the first device wafer comprises a first side of the first device wafer and a second side of the first device wafer opposite to the first side of the first device wafer, the first side of the first device wafer being in contact with the adhesion layer, and the second side of the first device wafer comprising a plurality of first bonding contacts configured to be bonded to the second device wafer.

6. The method of claim 5, wherein each of the plurality of second ablation structures extends through a portion of the second device wafer, wherein at least a majority of a cross-section of the plurality of second ablation structures overlaps with a cross-section of the plurality of first ablation structures when overlaying a cross-section of the carrier wafer having the cross-section of the plurality of first ablation structures and a cross-section of the second device wafer having the cross-section of the plurality of second ablation structures.

7. A method comprising:
   providing a structure comprising:
   a carrier wafer, and
   a first device wafer with an adhesion layer between the carrier wafer and the first device wafer, wherein the structure comprises a plurality of first ablation structures extending through the first device wafer and the adhesion layer;
   stacking a second device wafer on the first device wafer having the plurality of first ablation structures, the second device wafer having a plurality of second dies; and
   forming a plurality of second ablation structures in the second device wafer after stacking the second device wafer to the first device wafer, each pair of adjacent second dies being separated by one of the plurality of second ablation structures.

8. The method of claim 7, wherein each of the plurality of second ablation structures extend through a portion of the second device wafer.

9. The method of claim 8, wherein each of the plurality of second ablation structures has a depth no greater than one half of a thickness of the second device wafer.

10. The method of claim 9, further comprising:
    forming a second protective layer on the second device wafer before the plurality of second ablation structures are formed; and
    removing the second protective layer after the plurality of second ablation structures are formed.

11. The method of claim 7, wherein each of the plurality of first ablation structures extends through the first device wafer, the adhesion layer and a portion of the carrier wafer.

12. The method of claim 11, wherein the plurality of second ablation structures are formed in the second device wafer overlapping the plurality of first ablation structures, wherein at least a majority of a cross-section of the plurality of second ablation structures overlaps with a cross-section of the plurality of first ablation structures when overlaying a cross-section of the carrier wafer having the cross-section of the plurality of first ablation structures and a cross-section of the second device wafer having the cross-section of the plurality of second ablation structures.

13. The method of claim 12, wherein the first device wafer comprises a first side of the first device wafer and a second side of the first device wafer opposite to the first side of the first device wafer, the first side of the first device wafer being in contact with the adhesion layer, and the second side of the first device wafer comprising a plurality of first bonding contacts configured to be bonded to the second device wafer.

14. The method of claim 13, further comprising:
    providing a plurality of separated bonded semiconductor devices by dicing through at least the carrier wafer, the adhesion layer, the first device wafer and the second device wafer along at least the first ablation structures and the second ablation structures, wherein each of the plurality of separated bonded semiconductor devices comprises a die from each of the first device wafer and the second device wafer.

15. The method of claim 14, further comprising:
    decreasing adhesivity of the adhesion layer by between 90% and 99% by illuminating ultraviolet radiations with a power between 50 mJ/cm$^2$ and 500 mJ/cm$^2$ to the adhesion layer through the carrier wafer for a period between 10 seconds and 200 seconds before the plurality of separated bonded semiconductor devices are provided.

16. A method comprising:
    providing a carrier wafer having a plurality of innate ablation structures, each of the plurality of innate ablation structures extending through a portion of the carrier wafer;
    stacking a first device wafer on the carrier wafer with an adhesion layer between the carrier wafer and the first device wafer, the first device wafer comprising a plurality of first dies;
    forming a plurality of first ablation structures in the first device wafer overlapping the plurality of innate ablation structures;
    stacking a second device wafer to the first device wafer having the plurality of first ablation structures; and
    forming a plurality of second ablation structures in the second device wafer after stacking the second device wafer to the first device wafer.

17. The method of claim 16, wherein each of the plurality of innate ablation structures has a depth no greater than one half of a thickness of the carrier wafer.

18. The method of claim 17, wherein the first device wafer comprises a first side of the first device wafer and a second side of the first device wafer opposite to the first side of the first device wafer, the first side of the first device wafer being in contact with the adhesion layer, and the second side of the first device wafer comprising a plurality of first bonding contacts configured to be bonded to the second device wafer.

19. The method of claim 18, wherein each of the plurality of first ablation structures extends through a portion of the first device wafer, wherein at least a majority of a cross-section of the plurality of first ablation structures overlaps with a cross-section of the plurality of innate ablation structures when overlaying a cross-section of the carrier wafer having the cross-section of the plurality of innate ablation structures and a cross-section of the first device wafer having the cross-section of the plurality of first ablation structures.

20. The method of claim 19, wherein each of the plurality of first ablation structures has a depth no greater than one half of a thickness of the first device wafer, and wherein each pair of adjacent first dies are separated by one of the plurality of first ablation structures.

\* \* \* \* \*